US010381196B2

(12) United States Patent
Matsumoto

(10) Patent No.: US 10,381,196 B2
(45) Date of Patent: Aug. 13, 2019

(54) CHARGED PARTICLE BEAM WRITING APPARATUS AND METHOD FOR CALCULATING IRRADIATION COEFFICIENT

(71) Applicant: NuFlare Technology, Inc., Yokohama-shi (JP)

(72) Inventor: Hironobu Matsumoto, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 739 days.

(21) Appl. No.: 15/070,719

(22) Filed: Mar. 15, 2016

(65) Prior Publication Data

US 2016/0284509 A1 Sep. 29, 2016

(30) Foreign Application Priority Data

Mar. 23, 2015 (JP) ................................ 2015-059594
Oct. 1, 2015 (JP) ................................ 2015-196137

(51) Int. Cl.
*H01J 37/302* (2006.01)
*H01J 37/317* (2006.01)

(52) U.S. Cl.
CPC ...... *H01J 37/3174* (2013.01); *H01J 37/3026* (2013.01); *H01J 2237/31774* (2013.01); *H01J 2237/31793* (2013.01)

(58) Field of Classification Search
CPC ............... H01J 37/3174; H01J 37/3026; H01J 2237/31774; H01J 2237/31793; H01J 37/3175; H01J 37/3177
See application file for complete search history.

(56) References Cited

U.S. PATENT DOCUMENTS 5,936,252 A * 8/1999 Stickel ................ H01J 37/3174 250/491.1
6,275,604 B1 * 8/2001 Miyajima ........... H01J 37/3174 382/144

(Continued)

FOREIGN PATENT DOCUMENTS

JP 2010-123966 6/2010
KR 10-2014-0138357 A 12/2014

OTHER PUBLICATIONS

Office Action dated Dec. 14, 2016 in Korean Patent Application No. 10-2016-0034407 (with English translation).

(Continued)

*Primary Examiner* — Brooke Purinton
(74) *Attorney, Agent, or Firm* — Oblon, McClelland, Maier & Neustadt, L.L.P.

(57) ABSTRACT

A charged particle beam writing apparatus includes an enlarged pattern forming circuitry to form an enlarged pattern by enlarging a figure pattern to be written, depending on a shift number which is defined by the number of writing positions shifted in the x or y direction in plural writing positions where multiple writing is performed while shifting the position, a reduced pattern forming circuitry to form a reduced pattern by reducing the figure pattern, depending on the shift number, and an irradiation coefficient calculation circuitry to calculate an irradiation coefficient for modulating a dose of a charged particle beam irradiating each of small regions, using the enlarged and reduced patterns.

10 Claims, 28 Drawing Sheets

(56) References Cited

U.S. PATENT DOCUMENTS

| | | | | |
|---|---|---|---|---|
| 6,316,163 | B1 * | 11/2001 | Magoshi ............ | H01J 37/3174 250/492.22 |
| 6,415,432 | B1 * | 7/2002 | Saito .................. | H01J 37/3026 250/492.22 |
| 6,566,662 | B1 * | 5/2003 | Murakami .......... | H01J 37/3174 250/398 |
| 7,405,414 | B2 | 7/2008 | Sandstrom | |
| 2002/0027198 | A1 * | 3/2002 | Nagata ................ | H01J 37/3026 250/307 |
| 2008/0149859 | A1 * | 6/2008 | Yasuzato ............ | H01J 37/3174 250/492.22 |
| 2010/0124722 | A1 | 5/2010 | Fragner et al. | |
| 2014/0346369 | A1 | 11/2014 | Matsumoto et al. | |

OTHER PUBLICATIONS

J.E. Bresenham "Algorithm for computer control of a digital plotter", IBM Systems Journal, vol. 4, Mar. 1965, 6 pages.

Japanese Office Action with machine generated English translation dated Jun. 18, 2019 in corresponding Japanese Patent Application No. 2015-196137 (4pages).

* cited by examiner

Example of Forming Enlarged Figure

Example of Forming Reduced Figure

• Pixel Value $$f = \begin{cases} 0 & , L \leq (m-1)/2m \\ mL-(m-1)/2 & , (m-1)/2m < L < (m+1)/2m \\ 1 & , L \leq (m+1)/2m \end{cases}$$

• L is distance with sign from pixel to side of original pattern

| Shift Multiplicity | 2 | 4 | 5 | 8 | 9 | 10 | 16 |
|---|---|---|---|---|---|---|---|
| Shift Number m | 2 | 2 | 5 | 4 | 3 | 10 | 4 |

FIG. 18A
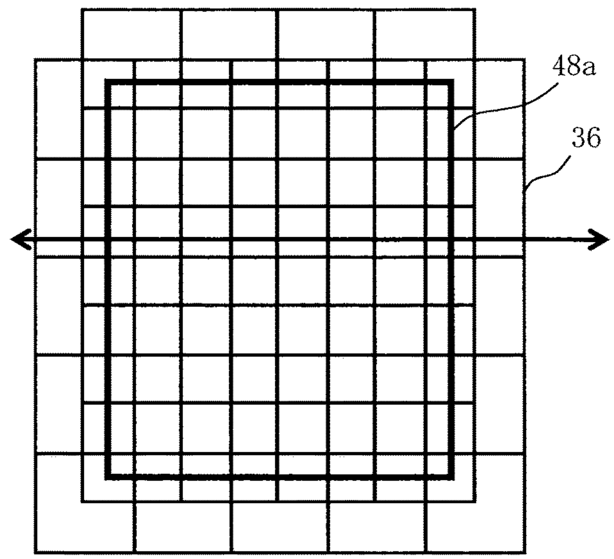
FIG. 18B
FIG. 18C
FIG. 18D
FIG. 18E
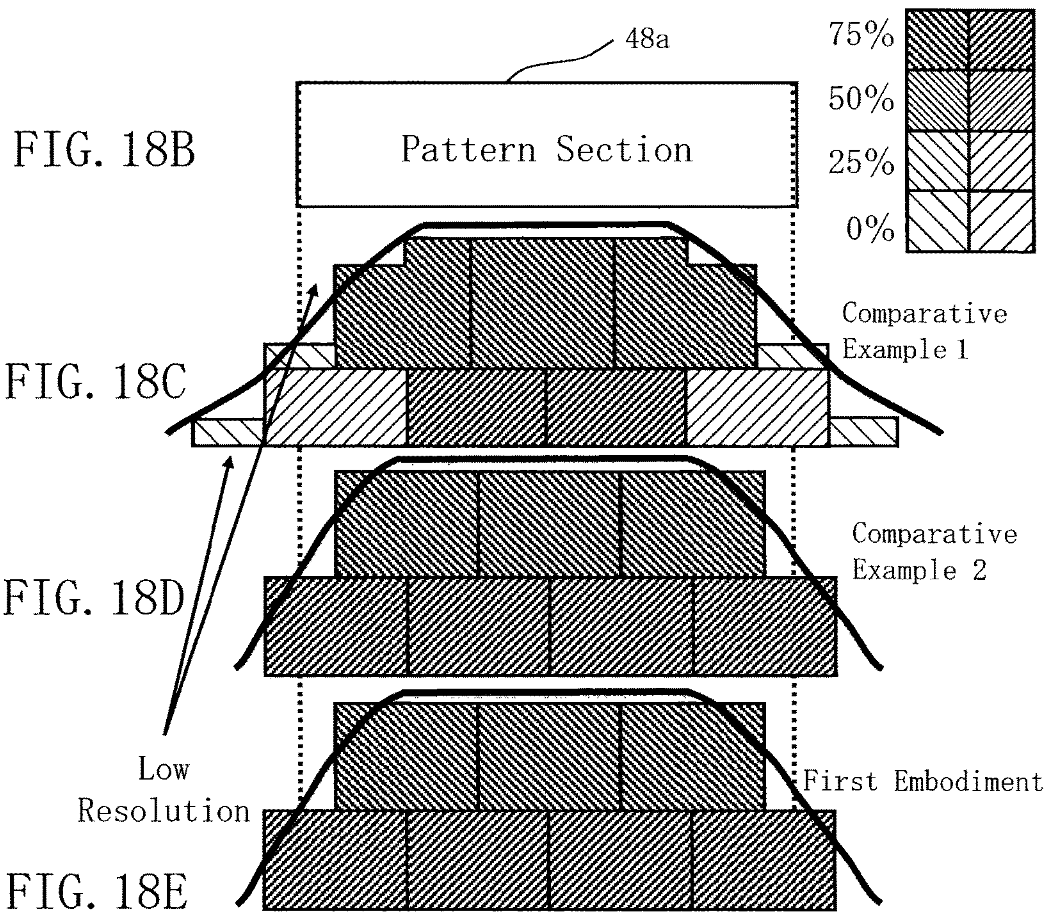

- Pixel Value $f = \begin{cases} 0 & , L \leq (M-1)/2M \\ ML-(M-1)/2 & , (M-1)/2M < L < (M+1)/2M \\ 1 & , L \leq (M+1)/2M \end{cases}$
- $1 \leq M \leq m$
- L is distance with sign from pixel to side of original pattern

| Shift Multiplicity | 2 | 4 | 5 | 8 | 9 | 10 | 16 |
|---|---|---|---|---|---|---|---|
| Shift Number m | 2 | 2 | 5 | 4 | 3 | 10 | 4 |

CHARGED PARTICLE BEAM WRITING APPARATUS AND METHOD FOR CALCULATING IRRADIATION COEFFICIENT

CROSS-REFERENCE TO RELATED APPLICATION

This application is based upon and claims the benefit of priority from the prior Japanese Patent Application No. 2015-059594 filed on Mar. 23, 2015 in Japan, and the prior Japanese Patent Application No. 2015-196137 filed on Oct. 1, 2015 in Japan, the entire contents of which are incorporated herein by reference.

BACKGROUND OF THE INVENTION

Field of the Invention

Embodiments of the present invention relate generally to a charged particle beam writing apparatus and a charged particle beam writing method, and more specifically, relate to a method for setting a dose for each pixel in multi-beam writing and raster scan writing, for example.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits becomes progressively narrower year by year. The electron beam writing technique, which intrinsically has excellent resolution, is used for writing or "drawing" a mask pattern on a mask blank with electron beams.

As an example employing the electron beam writing technique, a writing apparatus using multi-beams can be cited. Compared with the case of writing a pattern with a single electron beam, since in multi-beam writing it is possible to irradiate multiple beams at a time, the throughput can be greatly increased. For example, in a writing apparatus employing a multi-beam system, multi-beams are formed by letting portions of an electron beam emitted from an electron gun pass through a corresponding hole of a plurality of holes in the mask, blanking control is performed for each beam, and each unblocked beam is reduced by an optical system to decrease a mask image, and deflected by a deflector so as to irradiate a desired position on a target object or "sample".

For example, in a variable-shaped beam writing apparatus, since a beam of a specific shape can irradiate a desired position, it is possible to perform writing while making the position of a pattern edge and the position of a beam edge correspond to each other. On the other hand, in a multi-beam writing apparatus which cannot arbitrarily control the irradiation position of each beam, a writing target region is divided into a plurality of pixels, and a writing target pattern is converted into pixel patterns (also called bit patterns) which are to be written. Therefore, it is difficult, with respect to all the patterns, to make the positions of a pattern edge and a beam edge correspond to each other. Thus, in a multi-beam writing apparatus, it is desired to adjust a dose of a beam to irradiate a pixel on which the edge of a pattern is located, in order to form the pattern edge at a desired position. Conventionally, as a first method of determining the dose of each pixel, proportioning a beam dose to a pattern area density in a pixel can be cited. As a method similar to the first method, there is disclosed a technique, which is not the case where a beam dose is perfectly in accordance with a pattern area density, but the case where some pixels in an exposure region are exposed to a gray level of 100%, other pixels are exposed to a gray level of 50%, and remaining pixels are exposed to a 0% dose (not exposed at all) (for example, refer to Japanese Patent Application Laid-open (JP-A) No. 2010-123966). As a second method, there can be cited a technique in which if the central point of a pixel is inside a pattern, it is irradiated with a beam dose of 100%, and if a pixel central point is not inside a pattern, it is not irradiated with a beam.

According to the first method, in the case of not performing multiple writing executed while shifting positions, the gradient of a beam dose profile at a pattern edge can be steep, thereby writing in high contrast. However, in the case of performing multiple writing executed while shifting positions, if a pattern, even if only a small part of it, overlaps with a pixel, the pixel is irradiated with a beam, thereby making the gradient of the beam dose profile small and degrading the contrast. Therefore, it becomes difficult to develop the resist in a manner to achieve a highly precise position and critical dimension. According to the second method, when the position of a pixel boundary and the position of a pattern edge do not coincide with each other, since the resolution position of the resist deviates, it is intrinsically difficult to increase the pattern edge accuracy.

BRIEF SUMMARY OF THE INVENTION

According to one aspect of the present invention, a charged particle beam writing apparatus includes an enlarged pattern forming processing circuitry configured to form an enlarged pattern by enlarging a figure pattern to be written, depending on a shift number which is defined by a number of a plurality of writing positions shifted in one of x and y directions in a plurality of writing positions where multiple writing is performed while shifting a position; a reduced pattern forming processing circuitry configured to form a reduced pattern by reducing the figure pattern, depending on the shift number; an irradiation coefficient calculation processing circuitry configured to calculate an irradiation coefficient for modulating a dose of a charged particle beam irradiating each of a plurality of small regions obtained by dividing a writing region into meshes, using the enlarged pattern and the reduced pattern; and a writing mechanism including a charged particle beam source, a deflector, and a stage on which a target object is placed, and the writing mechanism configured to write the figure pattern on the target object by a multiple writing method performed while shifting the position, using the charged particle beam of the dose obtained for the each of the plurality of small regions by using the irradiation coefficient.

According to another aspect of the present invention, a charged particle beam writing method includes forming an enlarged pattern by enlarging a figure pattern to be written, depending on a shift number which is defined by a number of a plurality of writing positions shifted in one of x and y directions in a plurality of writing positions where multiple writing is performed while shifting a position; forming a reduced pattern by reducing the figure pattern, depending on the shift number; calculating, using the enlarged pattern and the reduced pattern, an irradiation coefficient for modulating a dose of a charged particle beam irradiating each of a plurality of small regions obtained by dividing a writing region into meshes; and writing the figure pattern on a target object by a multiple writing method performed while shifting the position, using the charged particle beam of the dose obtained for the each of the plurality of small regions by using the irradiation coefficient.

According to yet another aspect of the present invention, a charged particle beam writing apparatus includes an enlarged pattern forming processing circuitry configured to form an enlarged pattern by enlarging a figure pattern to be written, depending on a value less than or equal to a shift number defined by a number of a plurality of writing positions shifted in one of x direction and y direction in a plurality of writing positions where multiple writing is performed while shifting a position; a reduced pattern forming processing circuitry configured to form a reduced pattern by reducing the figure pattern, depending on the value less than or equal to the shift number; an irradiation coefficient calculation processing circuitry configured to calculate, using the enlarged pattern and the reduced pattern, an irradiation coefficient for modulating a dose of a charged particle beam irradiating each of a plurality of small regions obtained by dividing a writing region into meshes; and a writing mechanism configured to write the figure pattern on a target object by a multiple writing method performed while shifting the position, using the charged particle beam of the dose obtained for the each of the plurality of small regions by using the irradiation coefficient.

According to yet another aspect of the present invention, a charged particle beam writing method includes forming an enlarged pattern by enlarging a figure pattern to be written, depending on a value less than or equal to a shift number defined by a number of a plurality of writing positions shifted in one of x and y directions in a plurality of writing positions where multiple writing is performed while shifting a position; forming a reduced pattern by reducing the figure pattern, depending on the value less than or equal to the shift number; calculating, using the enlarged pattern and the reduced pattern, an irradiation coefficient for modulating a dose of a charged particle beam irradiating each of a plurality of small regions obtained by dividing a writing region into meshes; and writing the figure pattern on a target object by a multiple writing method performed while shifting the position, using the charged particle beam of the dose obtained for the each of the plurality of small regions by using the irradiation coefficient.

BRIEF DESCRIPTION OF THE DRAWINGS

FIGS. 18A to 18E illustrate a case of a beam dose profile of when writing a figure pattern, whose edge does not coincide with the pixel boundary, by the method of multiple writing with the shift multiplicity N=2 according to the first embodiment and comparative examples;

DETAILED DESCRIPTION OF THE INVENTION

In the embodiments below, there will be described a charged particle beam writing apparatus that can keep high dose contrast of beams and form highly accurate patterns in the writing technique in which patterns are formed using pixel patterns.

In the embodiments below, there will be described a configuration in which an electron beam is used as an example of a charged particle beam. The charged particle beam is not limited to the electron beam, and other charged particle beams such as an ion beam may also be used. Moreover, although a multi-beam writing apparatus is described below as an example of a charged particle beam writing apparatus, it is not limited thereto. For example, a raster scan type writing apparatus may also be used. In other words, the method according to each embodiment of the present invention can be applied to a writing system in which patterns are formed by combining pixel patterns (bit patterns).

First Embodiment

Figure 1:
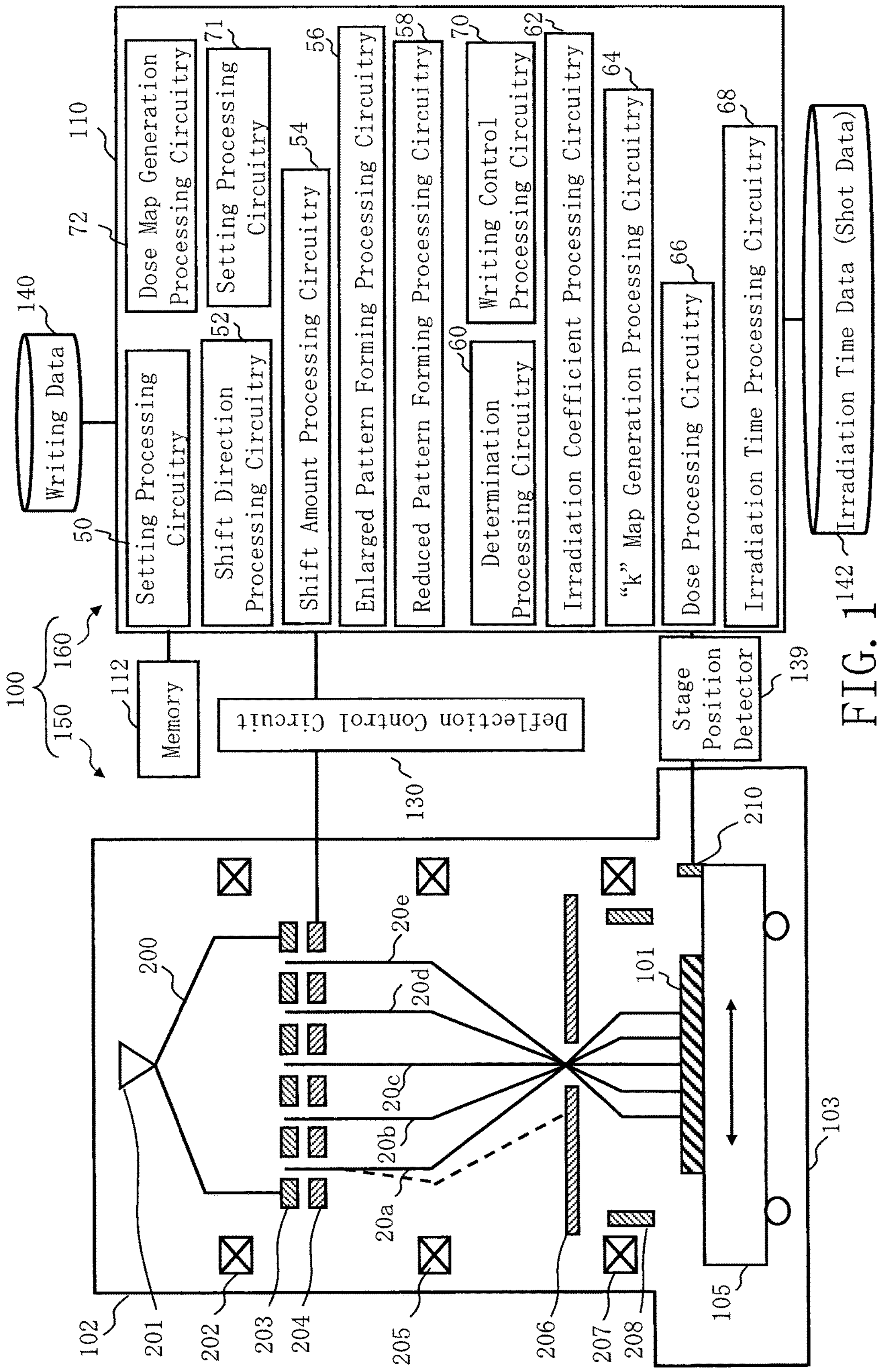
FIG. 1 is a schematic diagram showing a configuration of a writing apparatus according to a first embodiment.

FIG. 1 is a schematic diagram showing a configuration of a writing or "drawing" apparatus according to the first embodiment. As shown in FIG. 1, a writing apparatus 100 includes a writing mechanism 150 and a control unit 160. The writing apparatus 100 is an example of a multi charged particle beam writing apparatus. The writing mechanism 150 includes an electron optical column 102 and a writing chamber 103. In the electron optical column 102, there are arranged an electron gun 201, an illumination lens 202, a forming aperture array member 203, a blanking aperture array unit 204, a reducing lens 205, a limiting aperture member 206, an objective lens 207, and a deflector 208. In the writing chamber 103, an XY stage 105 is arranged. On the XY stage 105, there is placed a target object or "sample" 101 such as a mask blank serving as a writing target substrate when writing is performed. For example, the target object 101 is an exposure mask used for manufacturing semiconductor devices, or is a semiconductor substrate (silicon wafer) on which semiconductor elements are formed. A mirror 210 for measuring the position of the XY stage 105 is arranged on the XY stage 105.

The control unit 160 includes a control computer 110, a memory 112, a deflection control circuit 130, a stage position detector 139, and storage devices 140 and 142 such as magnetic disk drives. The control computer 110, the memory 112, the deflection control circuit 130, the stage position detector 139, and the storage devices 140 and 142 are connected with each other through a bus (not shown). Writing data that defines pattern data of a plurality of figure patterns is input into the storage device 140 (storage unit) from outside the writing apparatus 100 and stored therein.

In the control computer 110, there are arranged a setting unit 50, a shift direction calculation unit 52, a shift amount calculation unit 54, an enlarged pattern forming unit 56 (enlarged pattern forming processing circuitry), a reduced pattern forming unit 58 (reduced pattern forming processing circuitry), a determination unit 60, an irradiation coefficient calculation unit 62 (irradiation coefficient calculation processing circuitry), a "k" map generation unit 64, a dose calculation unit 66, an irradiation time calculation unit 68, a writing control unit 70, a setting unit 71, and a dose map generation unit 72. Each of the "units" such as the setting unit 50, shift direction calculation unit 52, shift amount calculation unit 54, enlarged pattern forming unit 56, reduced pattern forming unit 58, determination unit 60, irradiation coefficient calculation unit 62, "k" map generation unit 64, dose calculation unit 66, irradiation time calculation unit 68, writing control unit 70, setting unit 71, and dose map generation unit 72 includes a processing circuitry. The processing circuitry includes an electric circuit, a computer, a processor, a circuit board, a quantum circuit, or a semiconductor device, for example. Each of the "units" may use a common processing circuitry (same processing circuitry), or different processing circuitries (separate processing circuitries). Data which is input and output to/from the setting unit 50, shift direction calculation unit 52, shift amount calculation unit 54, enlarged pattern forming unit 56, reduced pattern forming unit 58, determination unit 60, irradiation coefficient calculation unit 62, "k" map generation unit 64, dose calculation unit 66, irradiation time calculation unit 68, writing control unit 70, setting unit 71, and dose map generation unit 72, and data being operated are stored in the memory 112 each time.

FIG. 1 shows a configuration necessary for explaining the first embodiment. Other configuration elements generally necessary for the writing apparatus 100 may also be included.

Figure 2A:
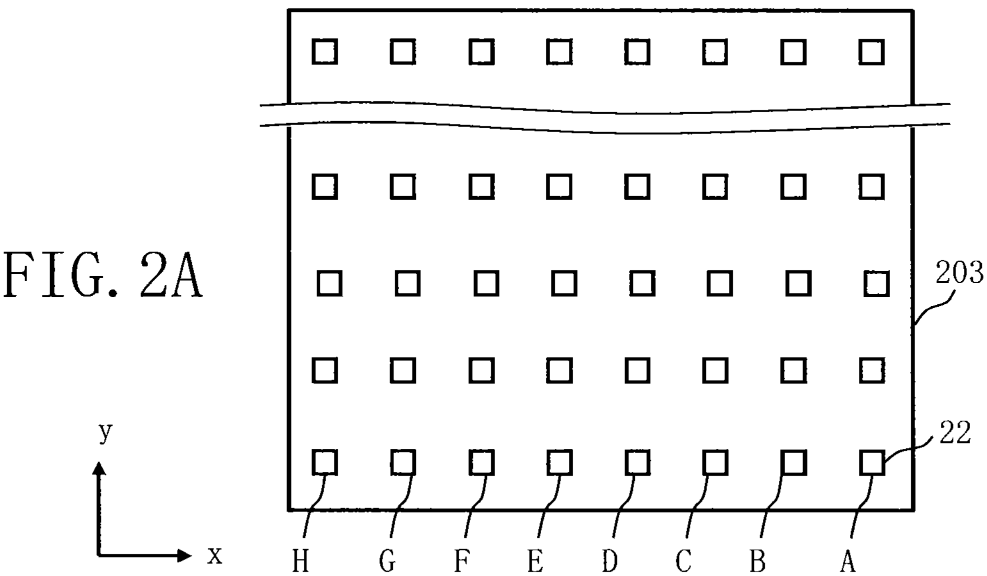
FIGS. 2A and 2B are conceptual diagrams each showing a configuration of a forming aperture array member according to the first embodiment.
Figure 2B:
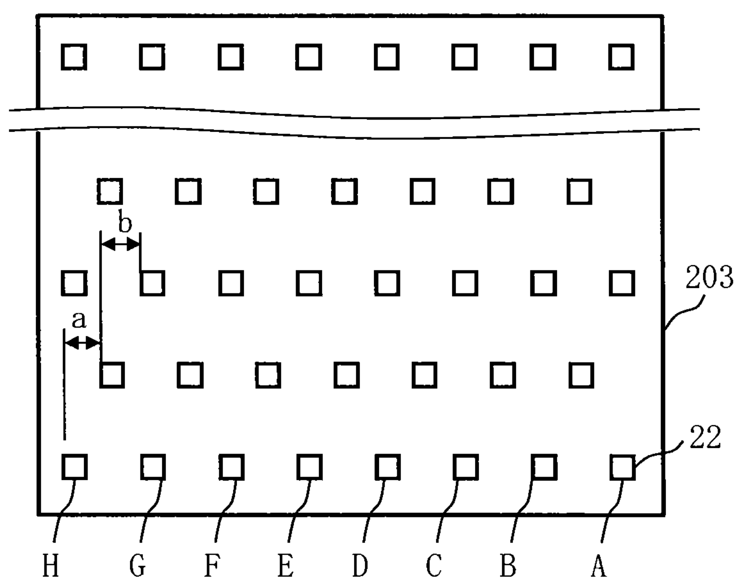

FIGS. 2A and 2B are conceptual diagrams each showing a configuration of a forming aperture array member according to the first embodiment. As shown in FIG. 2A, holes (openings) 22 of m rows long (y direction) and n columns wide (x direction) (m≥2, n≥2) are formed, like a matrix, at a predetermined arrangement pitch in the forming aperture array member 203. In FIG. 2A, for example, holes 22 of 512 (rows)×8 (columns) are formed. Each of the holes 22 is a quadrangle of the same dimensional shape. Alternatively, each of the holes 22 can be a circle of the same circumference. Here, there is shown an example in which each of the rows arrayed in the y direction has eight holes 22 from A to H in the x direction. Multi-beams 20 are formed by letting portions of an electron beam 200 individually pass through a corresponding hole of a plurality of holes 22. The case in which the holes 22 of two or more rows and columns are arranged in both the x and the y directions is shown here, but the arrangement is not limited thereto. For example, it is also acceptable that a plurality of holes 22 are arranged in only one row (x direction) or in only one column (y direction). That is, in the case of only one row, a plurality of holes 22 are arranged as a plurality of columns, and in the case of only one column, a plurality of holes 22 are arranged as a plurality of rows. The method of arranging the holes 22 is not limited to the case of FIG. 2A where holes are arranged like a grid in the length and width directions. For example, as shown in FIG. 2B, as to the first and second rows arrayed in the length direction (y direction), each hole in the first row and each hole in the second row may be mutually displaced in the width direction (x direction) by a dimension "a". Similarly, as to the second and third rows arrayed in the length direction (y direction), each hole in the second row and each hole in the third row may be mutually displaced in the width direction (x direction) by a dimension "b", for example.

Figure 3:
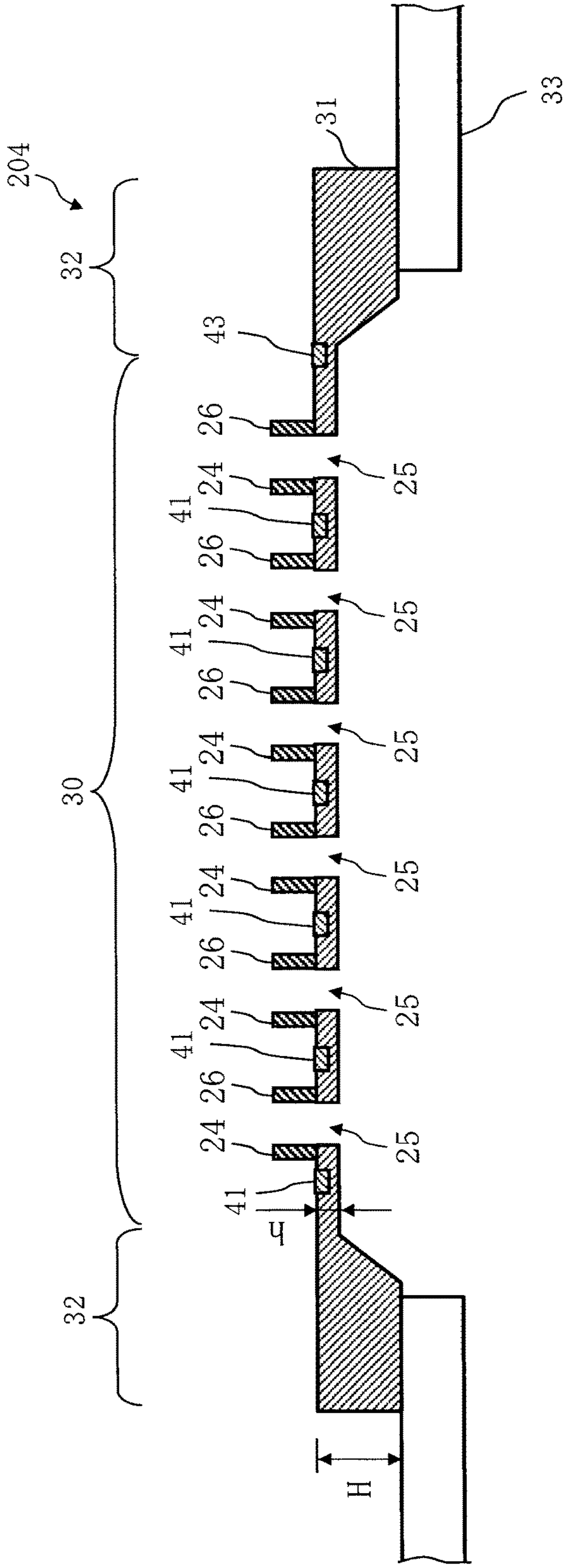
FIG. 3 is a sectional view showing a configuration of a blanking aperture array unit according to the first embodiment.
Figure 4:
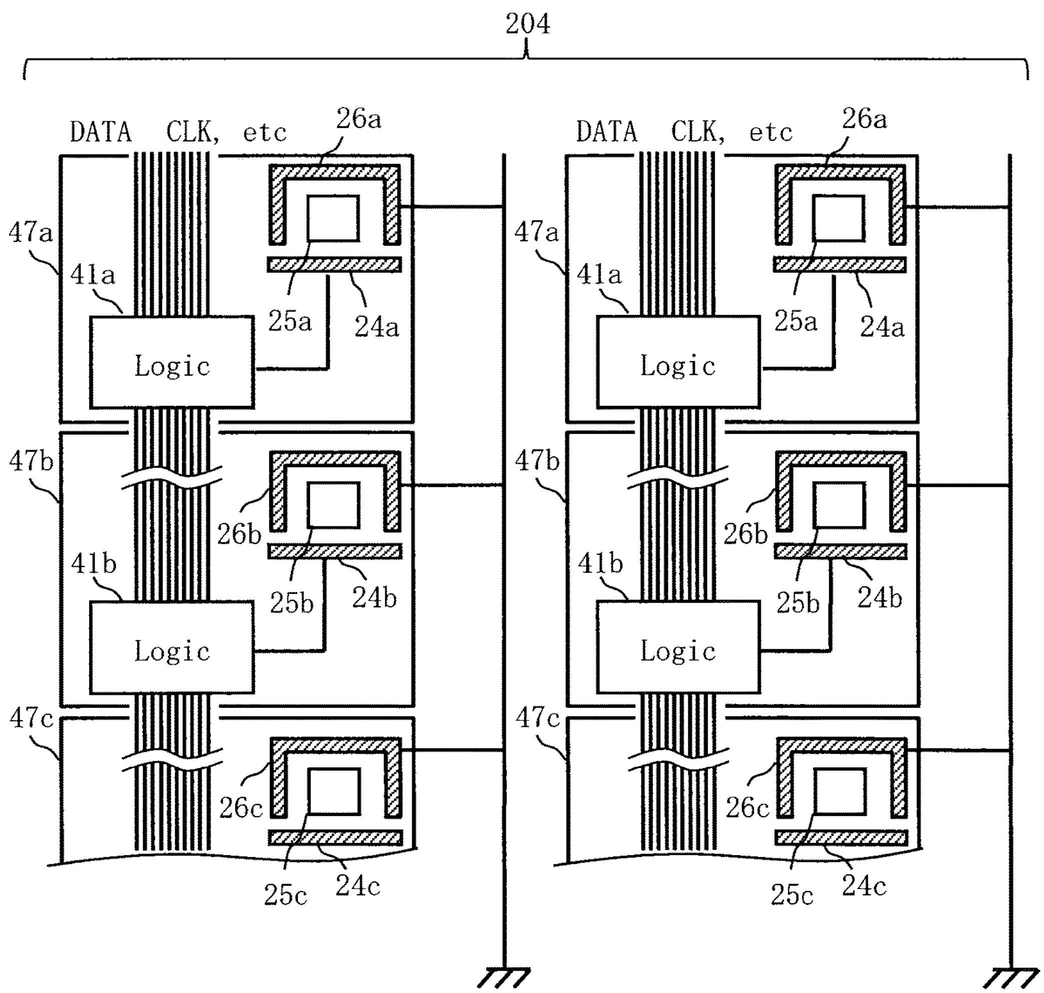
FIG. 4 is a top view conceptual diagram showing a part of the configuration in a membrane region of a blanking aperture array unit according to the first embodiment.

FIG. 3 is a sectional view showing a configuration of a blanking aperture array unit according to the first embodiment. FIG. 4 is a top view conceptual diagram showing a part of the configuration in a membrane region of a blanking aperture array unit according to the first embodiment. In FIGS. 3 and 4, the positional relation between a control electrode 24 and an counter electrode 26, and the positional relation between control circuits 41 and 43 are not in accordance with each other. With regard to the configuration of the blanking aperture array unit 204, as shown in FIG. 3, a semiconductor substrate 31 made of silicon, etc. is placed on a support table 33. The central part of the substrate 31 is shaved from the back side and processed to be a membrane region 30 (first region) having a thin film thickness h. The circumference surrounding the membrane region 30 is a circumference region 32 (second region) having a thick film thickness H. The upper surface of the membrane region 30 and the upper surface of the circumference region 32 are formed to be at the same height position, or substantially at the same height position. At the backside of the circumference region 32, the substrate 31 is supported to be on the support table 33. The central part of the support table 33 is open, and the position of the membrane region 30 is located in the opening part of the support table 33.2

In the membrane region 30, there are formed passage holes 25 (openings) through which multi-beams individually pass at the positions each corresponding to each hole 22 of the forming aperture array member 203 shown in FIG. 2A (or 2B). Then, as shown in FIGS. 3 and 4, pairs each composed of the control electrode 24 and the counter electrode 26 (blanker: blanking deflector) for blanking deflection are arranged on the membrane region 30, where each pair is close to a corresponding passage hole 25, and the control electrode 24 and the counter electrode 26 are at opposite sides of the corresponding passage hole 25. Moreover, close to each passage hole 25 in the membrane region 30, there is arranged the control circuit 41 (logic circuit) for applying a deflection voltage to the control electrode 24 for each passage hole 25. The counter electrode 26 for each beam is earthed (grounded).

As shown in FIG. 4, for example, 10-bit parallel lines for control signals are connected to each control circuit 41. In addition to the 10-bit parallel lines for controlling, for example, clock signal lines and wiring lines for a power source are connected to each control circuit 41. A part of the parallel lines may be used as the clock signal lines and the power source wiring lines. An individual blanking mechanism 47 composed of the control electrode 24, the counter electrode 26, and the control circuit 41 is configured for each beam of the multi-beams. In the example of FIG. 3, the control electrode 24, the counter electrode 26, and the control circuit 41 are arranged in the membrane region 30 having a thin film thickness of the substrate 31. However, it is not limited thereto.

The electron beam 20 passing through a corresponding passage hole 25 is deflected by a voltage independently applied to the two electrodes 24 and 26 being a pair. Blanking control is performed by this deflection. In other words, each pair of the control electrode 24 and the counter electrode 26 blanking deflects a corresponding beam of multi-beams each having passed through a corresponding one of a plurality of holes 22 (openings) of the forming aperture array member 203.

Operations of the writing mechanism 150 in the writing apparatus 100 will be described below. The electron beam 200 emitted from the electron gun 201 (emitter, charged particle beam source) almost perpendicularly (e.g., vertically) illuminates the whole of the forming aperture array member 203 by the illumination lens 202. A plurality of holes (openings) each being a quadrangle are formed in the forming aperture array member 203. The region including all the plurality of holes is irradiated by the electron beam 200. For example, a plurality of quadrangular electron beams (multi-beams) 20*a* to 20*e* are formed by letting portions of the electron beam 200 which irradiate the positions of a plurality of holes individually pass through a corresponding hole of the plurality of holes of the forming aperture array member 203. The multi-beams 20*a* to 20*e* individually pass through a corresponding blanker (first deflector: individual blanking mechanism) of the blanking aperture array unit 204. Each blanker deflects (blanking deflects) the electron beam 20 which is individually passing.

The multi-beams 20*a*, 20*b*, . . . , 20*e* having passed through the blanking aperture array unit 204 are reduced by the reducing lens 205, and go toward the hole in the center of the limiting aperture member 206. At this stage, the electron beam 20 which was deflected by the blanker of the blanking aperture array unit 204 deviates from the hole in the center of the limiting aperture member 206 and is blocked by the limiting aperture member 206. On the other hand, the electron beam 20 which was not deflected by the blanker of the blanking aperture array unit 204 passes through the hole in the center of the limiting aperture member 206 as shown in FIG. 1. Blanking control is performed by ON/OFF of the individual blanking mechanism so as to control ON/OFF of beams. Thus, the limiting aperture member 206 blocks each beam which was deflected to be in a beam OFF state by the individual blanking mechanism. Then, one shot beam is formed by a beam which has been made during a period from becoming a beam ON state to becoming a beam OFF state and has passed through the limiting aperture member 206. The multi-beams 20 having passed through the limiting aperture member 206 are focused by the objective lens 207 in order to be a pattern image of a desired reduction ratio, and respective beams (the entire multi-beams 20) having passed through the limiting aperture member 206 are collectively deflected in the same direction by the deflector 208 in order that respective beam irradiation positions on the target object 101 may be irradiated. While the XY stage 105 is continuously moving, controlling is performed by the deflector 208 so that irradiation positions of beams may follow (track) the movement of the XY stage 105, for example. The position of the XY stage 105 is measured by way of radiating a laser from the stage position detector 139 to the mirror 210 on the XY stage 105 and using its catoptric light. The multi-beams 20 irradiating at the same time are ideally aligned at pitches obtained by multiplying the arrangement pitch of a plurality of holes of the forming aperture array member 203 by a desired reduction ratio described above. The writing apparatus 100 performs a writing operation by the irradiation of multi-beams 20, used as shot beams, per pixel by moving the beam deflection position by the deflector 208 along a writing sequence controlled by the writing control unit 70 while following the movement of the XY stage 105 during each tracking operation. When writing a desired pattern, a beam required according to a pattern is controlled to be ON by blanking control.

Figure 5:
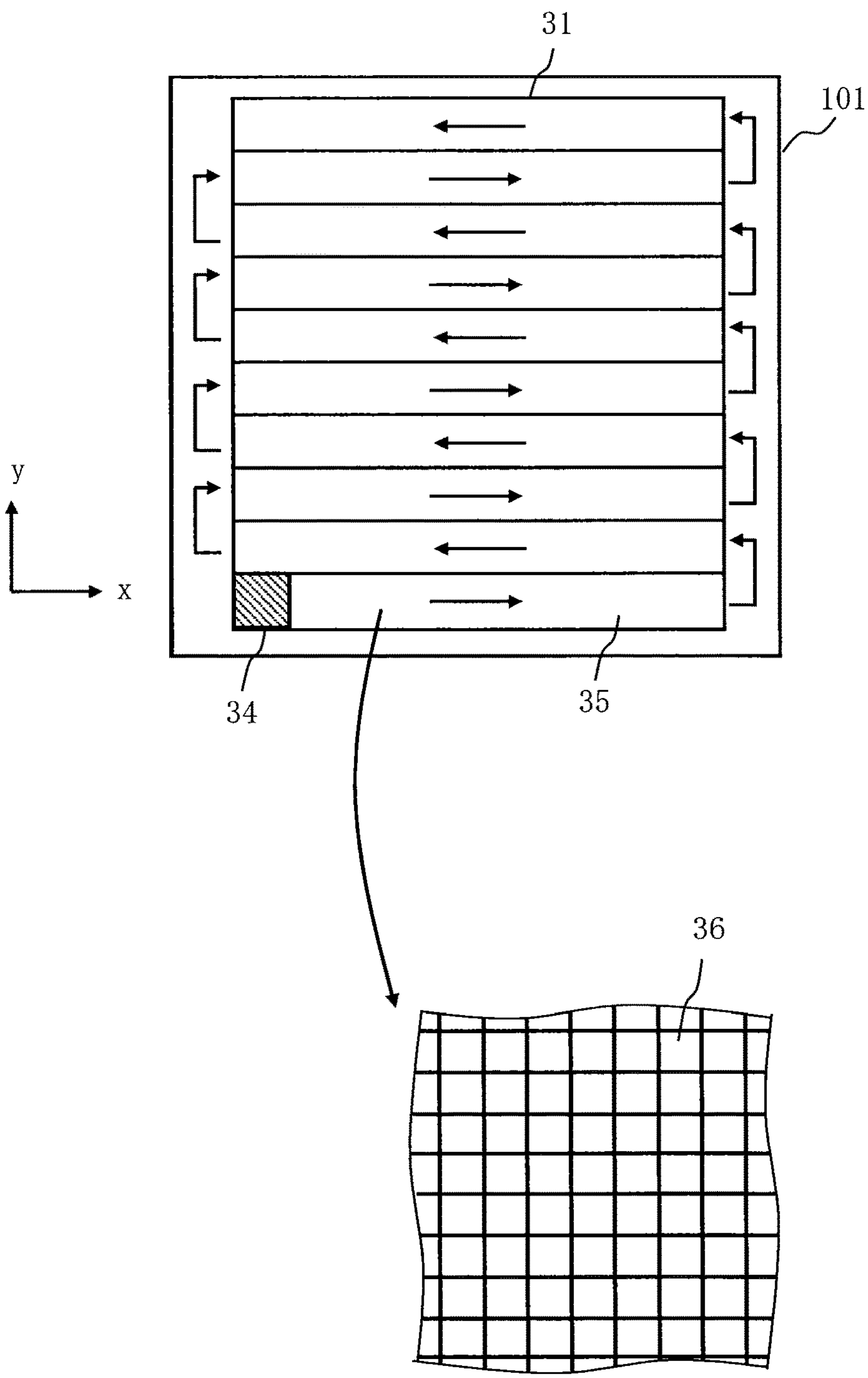
FIG. 5 illustrates a writing order according to the first embodiment.

FIG. 5 illustrates a writing order according to the first embodiment. A writing region 31 (or chip region to be written) of the target object 101 is divided into strip-shaped stripe regions 35 each having a predetermined width. Then, each stripe region 35 is virtually divided into a plurality of mesh pixel regions 36 (pixels). Preferably, the size of the pixel region 36 (pixel) is, for example, a beam size, or smaller than a beam size. For example, the size of the pixel region is preferably about 10 nm. The pixel region 36 (pixel) serves as a unit region for irradiation per beam of multi-beams.

When writing the target object 101 with the multi-beams 20, an irradiation region 34 is irradiated by one-time irradiation of the multi-beams 20. As described above, irradiation is collectively performed per pixel sequentially and continuously with multi-beams 20 being shot beams by moving the beam deflection position by the deflector 208 while following the movement of the XY stage 105 during the tracking operation. It is determined, based on the writing sequence, which beam of multi-beams irradiates which pixel on the target object 101. The region of the beam pitch (x direction) multiplied by the beam pitch (y direction), where the beam pitch is between beams adjoining in the x or y direction of multi-beams on the surface of the target object 101, is configured by a region (sub-pitch region) composed of n×n pixels. For example, when the XY stage 105 moves in the −x direction by the length of beam pitch (x direction) by one tracking operation, n pixels are written in the x or y direction (or diagonal direction) by one beam while the irradiation position is shifted. Then, by the next tracking operation, another n pixels in the same n×n pixel region are similarly written by a different beam from the one used above. Thus, n pixels are written each time of n times of tracking operations, using a different beam each time, thereby writing all the pixels in one region of n×n pixels. With respect also to other regions each composed of n×n pixels in the irradiation region of multi-beams, the same operation is performed at the same time to be written similarly. This operation makes it possible to write all the pixels in the irradiation region 34. By repeating this operation, the entire corresponding stripe region 35 can be written. It is possible in the writing apparatus 100 to write a desired pattern by combining pixel patterns (bit patterns) which are formed by applying a beam of a required dose to a required pixel.

Figure 6:
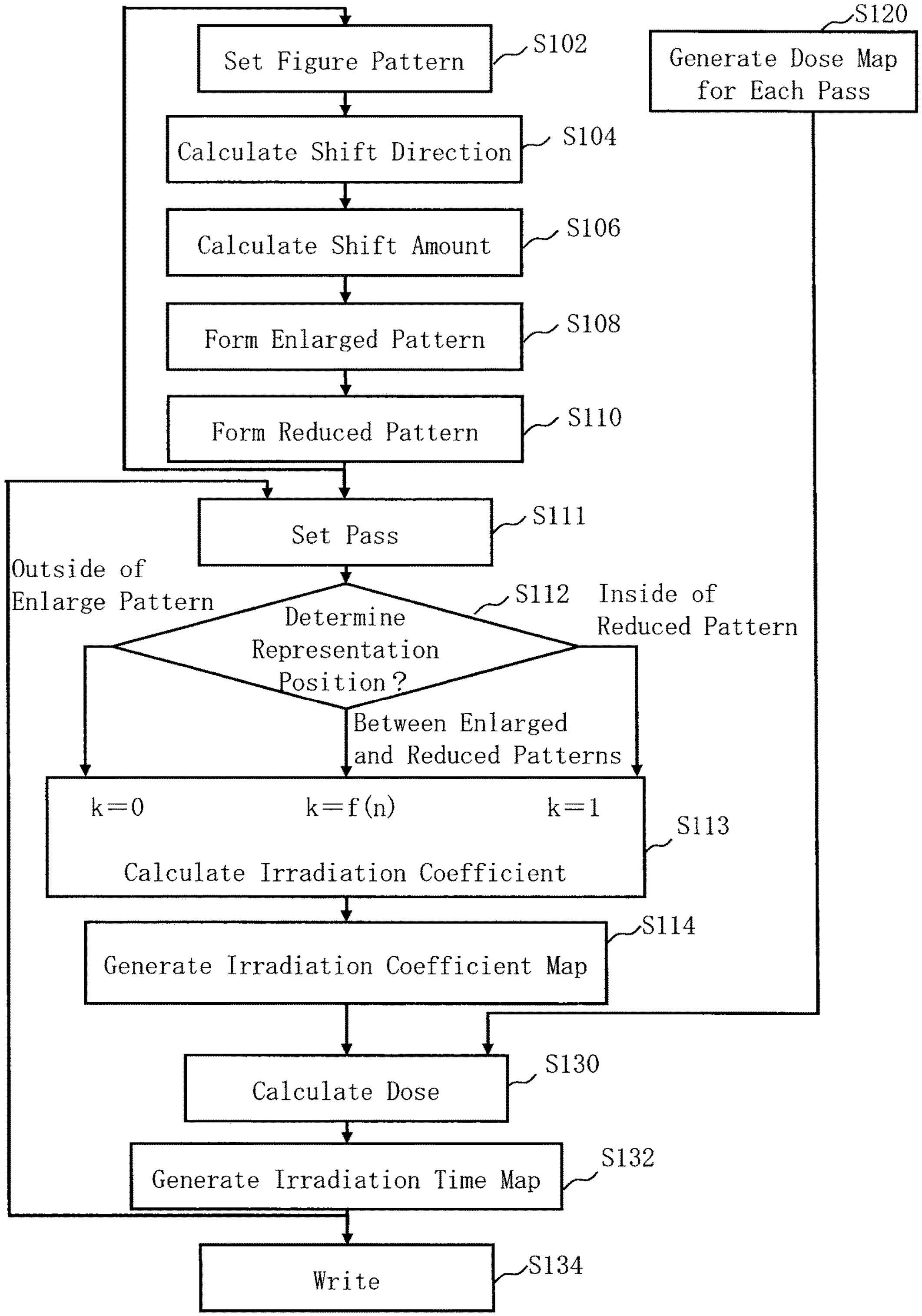
FIG. 6 is a flowchart showing main steps of a writing method according to the first embodiment.

FIG. 6 is a flowchart showing main steps of a writing method according to the first embodiment. As shown in FIG. 6, a series of steps of a figure pattern setting step (S102), a shift direction calculation step (S104), a shift amount calculation step (S106), an enlarged pattern formation step (S108), a reduced pattern formation step (S110), a pass setting step (S111), a determination step (S112), an irradiation coefficient calculation step (S113), an irradiation coefficient map generation step (S114), a dose map generation step (S120), a dose calculation step (S130), an irradiation time map generation step (S132), and a writing step (S134) are executed.

In the figure pattern setting step (S102), the setting unit 50 reads writing data from the storage device 140, and sets one of a plurality of figure patterns defined in the writing data.

In the shift direction calculation step (S104), the shift direction calculation unit 52 calculates a shift direction of each vertex of a figure pattern for shifting the figure pattern in order to enlarge it, for example. Although the direction for enlargement is calculated herein as an example, it is also preferable to calculate a direction for reduction.

Figure 7:
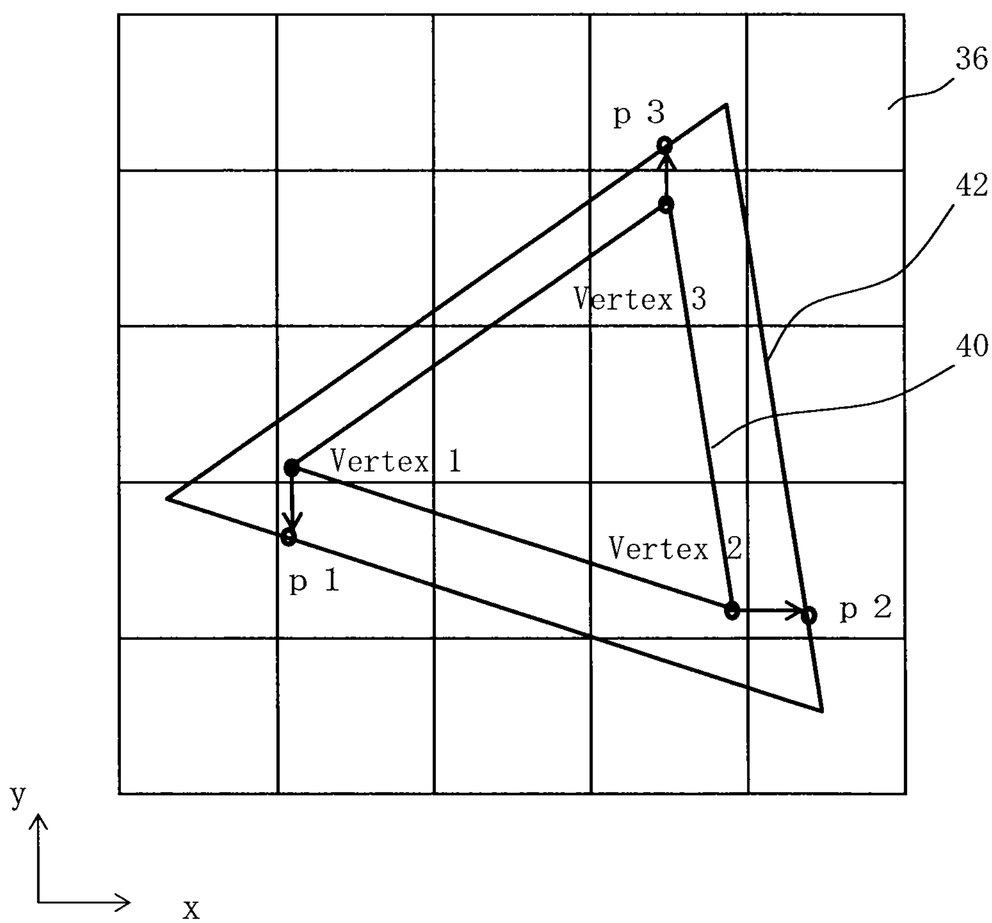
FIG. 7 illustrates a method for forming an enlarged figure pattern according to the first embodiment.

FIG. 7 illustrates a method for forming an enlarged figure pattern according to the first embodiment. An enlarged figure pattern 42 shown in FIG. 7 is an example of enlargement of a figure pattern 40 of a triangle with vertices 1, 2, and 3. In FIG. 7, the side s1, side s2, and side s3 are sides of the enlarged figure pattern 42. The side s1 is on the straight line which is parallel to the side connecting the vertices 1 and 2, and passes through the point p1. The side s2 is on the straight line which is parallel to the side connecting the vertices 2 and 3, and passes through the point p2. The side s3 is on the straight line which is parallel to the side connecting the vertices 3 and 1, and passes through the point p3. The arrows extending from the vertices 1, 2, and 3 in the figure show arrangement directions from the vertex 1 to the point p1, from the vertex 2 to the point p2, and from the vertex 3 to the point p3. The shift direction calculation unit 52 calculates a difference between the coordinates of the vertices 1 and 2, and obtains an arrangement direction from the vertex 1 to the point p1, based on the size of the absolute value of the calculated difference and on the sign. Specifically, first, defining the coordinate v1 of the vertex 1 to be v1=(x1, y1) and the coordinate v2 of the vertex 2 to be v2=(x2, y2), dx=x2−x1 and dy=y2−y1 are calculated. Next, the absolute values |dx| and |dy| of the calculated dx and dy are compared. If the value of |dx| is smaller, the direction of the sign of dx along the x-axis is determined as the arrangement direction from the vertex 1 to the point p1, and if the value of |dy| is smaller, the direction of the sign of dy along the y-axis is determined as the arrangement direction from the vertex 1 to the point p1. In FIG. 7, with respect to the side connecting the coordinates v1 and v2, |dy| is smaller than |dx|, and the sign of dy is negative. Therefore, the point p1 is arranged in the −y direction from the vertex 1.

Similarly, the shift direction calculation unit 52 calculates a difference between coordinates of the vertices 2 and 3, and obtains an arrangement direction from the vertex 2 to the point p2, based on the size of the absolute value of the calculated difference and on the sign. Specifically, defining the coordinate v3 of the vertex 3 to be v3=(x3, y3), dx=x3−x2 and dy=y3−y2 are calculated. Next, the absolute values |dx| and |dy| of the calculated dx and dy are compared. If the value of |dx| is smaller, the direction of the sign of dx along the x-axis is determined as the arrangement direction from the vertex 2 to the point p2, and if the value of |dy| is smaller, the direction of the sign of dy along the y-axis is determined as the arrangement direction from the vertex 2 to the point p2. In FIG. 7, with respect to the side connecting the vertices 2 and 3, |dx| is smaller than |dy|, and the sign of dx is positive. Therefore, p2 is arranged in the +x direction from the vertex 2.

Similarly, the shift direction calculation unit 52 calculates a difference between coordinates of the vertices 3 and 1, and obtains an arrangement direction from the vertex 3 to the point p3, based on the size of the absolute value of the calculated difference and on the sign. Specifically, defining the coordinate v3 of the vertex 3 to be v3=(x3, y3), dx=x3-x2 and dy=y3−y2 are calculated. Next, the absolute values |dx| and |dy| of the calculated dx and dy are compared. If the value of |dx| is smaller, the direction of the sign of dx along the x-axis is determined as the arrangement direction from the vertex 3 to the point p3, and if the value of |dy| is smaller, the direction of the sign of dy along the y-axis is determined as the arrangement direction from the vertex 3 to the point p3. In FIG. 7, with respect to the side connecting the vertices 3 and 1, |dy| is smaller than |dx|, and the sign of dy is positive. Therefore, p3 is arranged in the +y direction from the vertex 3.

In the shift amount calculation step (S106), the shift amount calculation unit 54 calculates a shift amount "s" used for enlarging the figure pattern 40 to the enlarged figure pattern 42. Specifically, the shift amount "s" is defined by the following equation (1) using a grid width "w" of a pixel 36, and a shift number "m".

$$s=w/(2\cdot m) \tag{1}$$

Here, the shift number "m" is defined by the number of a plurality of writing positions which shifted in the x direction or the y direction in a plurality of writing positions where writing is performed in the multiple writing performed while shifting the position. The shift number "m" can be obtained according to the multiplicity (shift multiplicity) of shifting the position in the multiple writing, which has been set as a writing processing condition in the writing data to be written on the target object 101.

Figures 8A, 8B, 8C, 8D, 8E, 8F, 8G, 8H:
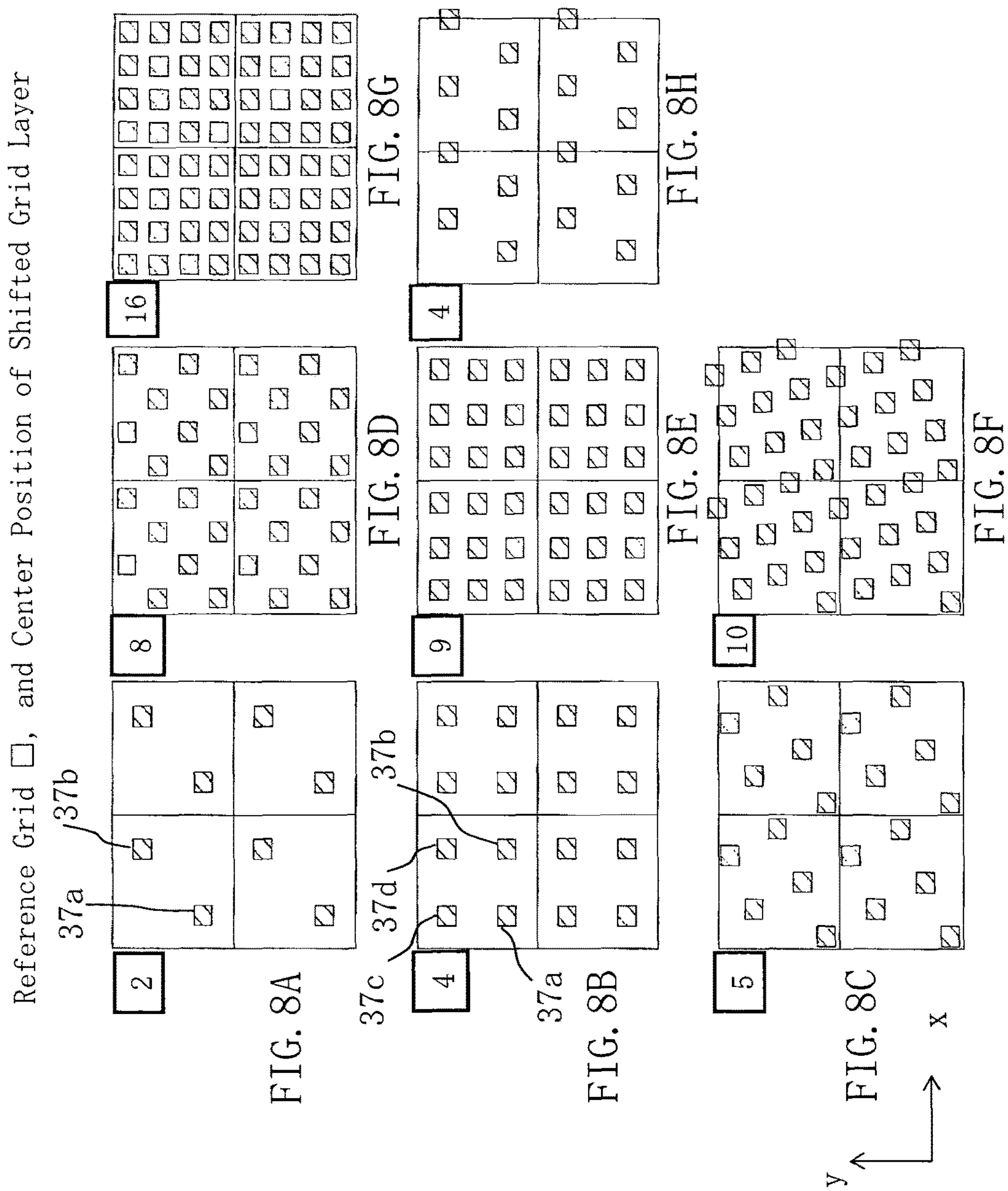
FIGS. 8A to 8H each show an example of a relation between a shift number and a shift multiplicity according to the first embodiment.

FIGS. 8A to 8H each show an example of a relation between a shift number and a shift multiplicity according to the first embodiment. Here, the irradiation region 34 which can be irradiated by one-time irradiation of multi-beams is shown as a grid. FIG. 8A shows an example of a virtual reference grid and two writing positions in the multiple writing with shift multiplicity N=2. In the example of FIG. 8A, the irradiation region 34 (grid) centered on a pixel 37*a* is irradiated in the first writing. Then, the irradiation region 34 (grid) centered on a pixel 37*b* is irradiated in the second writing. Therefore, in the example of FIG. 8A, the multiplicity (shift multiplicity) is N=2 in the multiple writing performed while shifting the position. In the case of FIG. 8A, since there are two writing positions, the pixels 37*a* and 37*b* shifted in the x direction, the shift number "m" in the x direction is 2. Since there are two writing positions, the pixels 37*a* and 37*b* shifted in the y direction, the shift number "m" in the y direction is 2. Therefore, since the number of a plurality of writing positions shifted in each of the x and y directions is two, the shift number "m" is 2.

In the example of FIG. 8B, the irradiation region 34 (grid) centered on the pixel 37*a* is irradiated in the first writing. Then, the irradiation region 34 (grid) centered on the pixel 37*b* is irradiated in the second writing. The irradiation region 34 (grid) centered on a pixel 37*c* is irradiated in the third writing. Then, the irradiation region 34 (grid) centered on a pixel 37*d* is irradiated in the fourth writing. Therefore, in the example of FIG. 8B, the multiplicity (shift multiplicity) is N=4 in the multiple writing performed while shifting the position. In the case of FIG. 8B, since there are two writing positions, the pixels 37*a* and 37*b* shifted in the x direction, the shift number "m" in the x direction is 2. Since there are two writing positions, the pixels 37*a* and 37*c* (or pixels 37*b* and 37*d*) shifted in the y direction, the shift number "m" in the y direction is 2. Therefore, since the number of a plurality of writing positions shifted in each of the x and y directions is two, the shift number "m" is 2.

In the example of FIG. 8C, similarly, each of the irradiation regions 34 (grids) centered on five pixels is irradiated. Therefore, in the example of FIG. 8C, the multiplicity (shift multiplicity) is N=5 in the multiple writing performed while shifting the position. In the case of FIG. 8C, since there are five writing positions shifted in the x direction, the shift number "m" in the x direction is 5. Since there are five writing positions shifted in the y direction, the shift number "m" in the y direction is 5. Therefore, since the number of a plurality of writing positions shifted in each of the x and y directions is five, the shift number "m" is 5.

In the example of FIG. 8D, similarly, each of the irradiation regions 34 (grids) centered on eight pixels is irradiated. Therefore, in the example of FIG. 8D, the multiplicity (shift multiplicity) is N=8 in the multiple writing performed while shifting the position. In the case of FIG. 8D, since there are four writing positions shifted in the x direction, the shift number "m" in the x direction is 4. Since there are four writing positions shifted in the y direction, the shift number "m" in the y direction is 4. Therefore, since the number of a plurality of writing positions shifted in each of the x and y directions is four, the shift number "m" is 4.

In the example of FIG. 8E, similarly, each of the irradiation regions 34 (grids) centered on nine pixels is irradiated. Therefore, in the example of FIG. 8E, the multiplicity (shift multiplicity) is N=9 in the multiple writing performed while shifting the position. In the case of FIG. 8E, since there are three writing positions shifted in the x direction, the shift number "m" in the x direction is 3. Since there are three writing positions shifted in the y direction, the shift number "m" in the y direction is 3. Therefore, since the number of a plurality of writing positions shifted in each of the x and y directions is three, the shift number "m" is 3.

In the example of FIG. 8F, similarly, each of the irradiation regions 34 (grids) centered on ten pixels is irradiated. Therefore, in the example of FIG. 8F, the multiplicity (shift multiplicity) is N=10 in the multiple writing performed while shifting the position. In the case of FIG. 8F, since there are ten writing positions shifted in the x direction, the shift number "m" in the x direction is 10. Since there are ten writing positions shifted in the y direction, the shift number "m" in the y direction is 10. Therefore, since the number of a plurality of writing positions shifted in each of the x and y directions is ten, the shift number "m" is 10.

In the case of FIG. 8G, similarly, each of the irradiation regions 34 (grids) centered on sixteen pixels is irradiated. Therefore, in the example of FIG. 8G, the multiplicity (shift multiplicity) is N=16 in the multiple writing performed while shifting the position. In the case of FIG. 8G, since there are four writing positions shifted in the x direction, the shift number "m" in the x direction is 4. Since there are four writing positions shifted in the y direction, the shift number "m" in the y direction is 4. Therefore, since the number of a plurality of writing positions shifted in each of the x and y directions is four, the shift number "m" is 4. In the case of FIG. 8H, the multiplicity (shift multiplicity) is N=4 in the multiple writing performed while shifting the position. In the case of FIG. 8H, since there are four writing positions shifted in the x direction, the shift number "m" in the x direction is 4. Since there are four writing positions shifted in the y direction, the shift number "m" in the y direction is 4. Therefore, since the number of a plurality of writing positions shifted in each of the x and y directions is four, the shift number "m" is 4.

Figure 9:
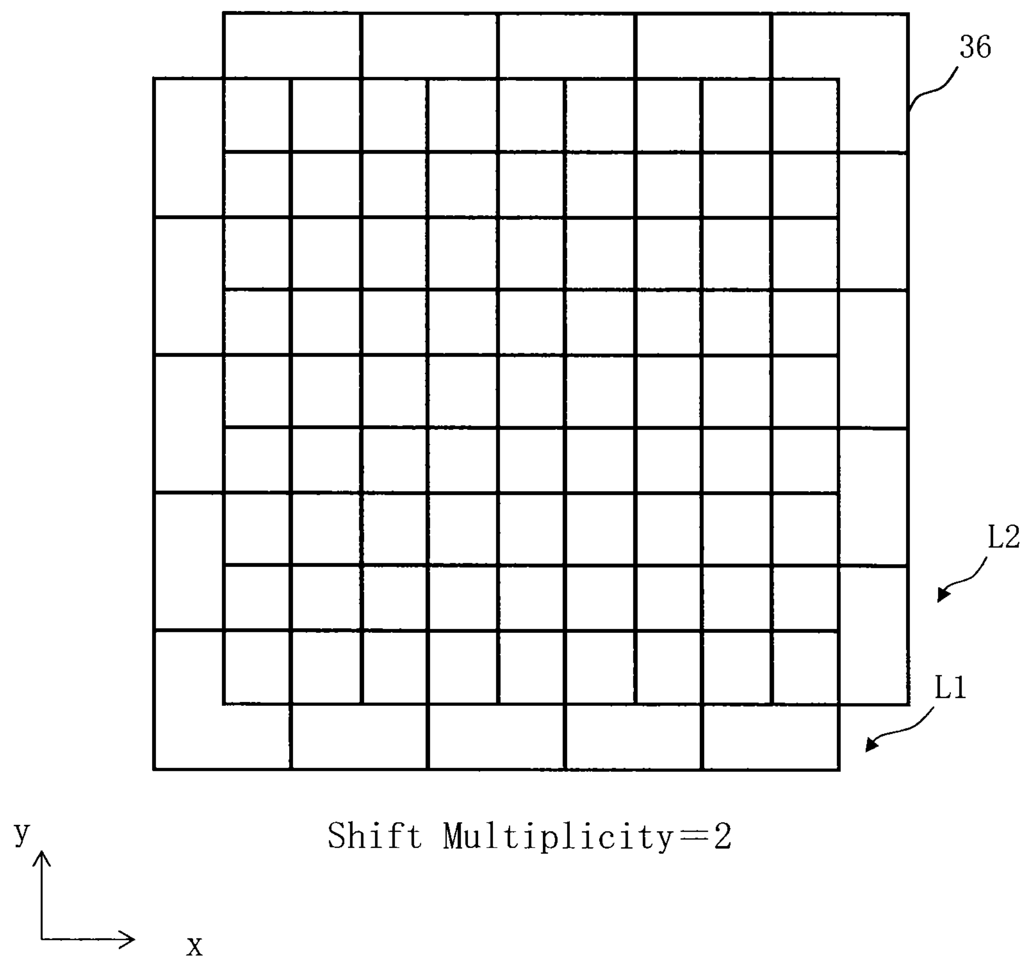
FIG. 9 shows an example of a pixel layer in the case of the shift multiplicity N=2 according to the first embodiment.

FIG. 9 shows an example of a pixel layer in the case of the shift multiplicity N=2 according to the first embodiment. FIG. 9 shows the case of the multiple writing with the shift multiplicity N=2, where, after the first writing, the position is shifted in the x and y directions each by ½ pixel to perform the second writing.

Figure 10:
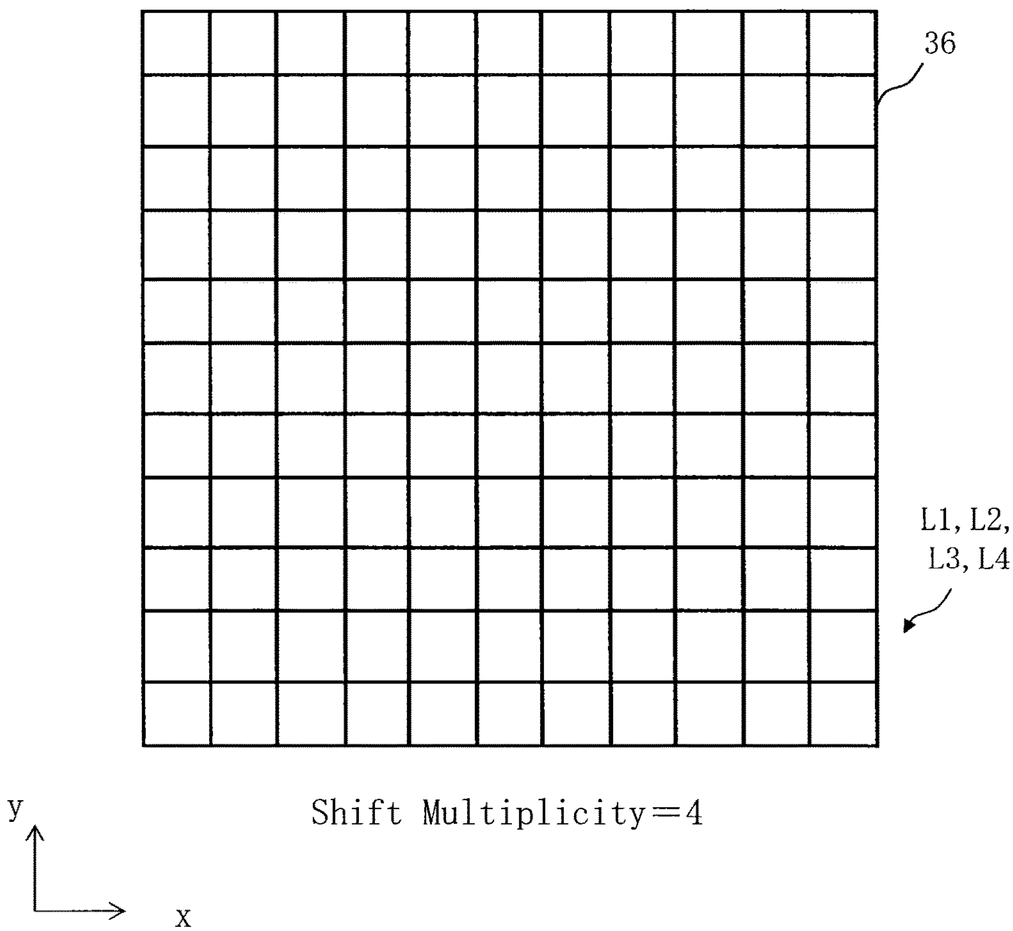
FIG. 10 shows an example of a pixel layer in the case of the shift multiplicity N=4 according to the first embodiment.

FIG. 10 shows an example of a pixel layer in the case of the shift multiplicity N=4 according to the first embodiment. FIG. 10 shows the case of the multiple writing with the shift multiplicity N=4, where, after the first writing, the position is shifted in the x and y directions each by ½ pixel to perform the second writing, after the second writing, it is shifted in the x and y directions each by ½ pixel to perform the third writing, and, after the third writing, it is shifted in the x and y directions each by ½ pixel to perform the fourth writing.

Figure 11:
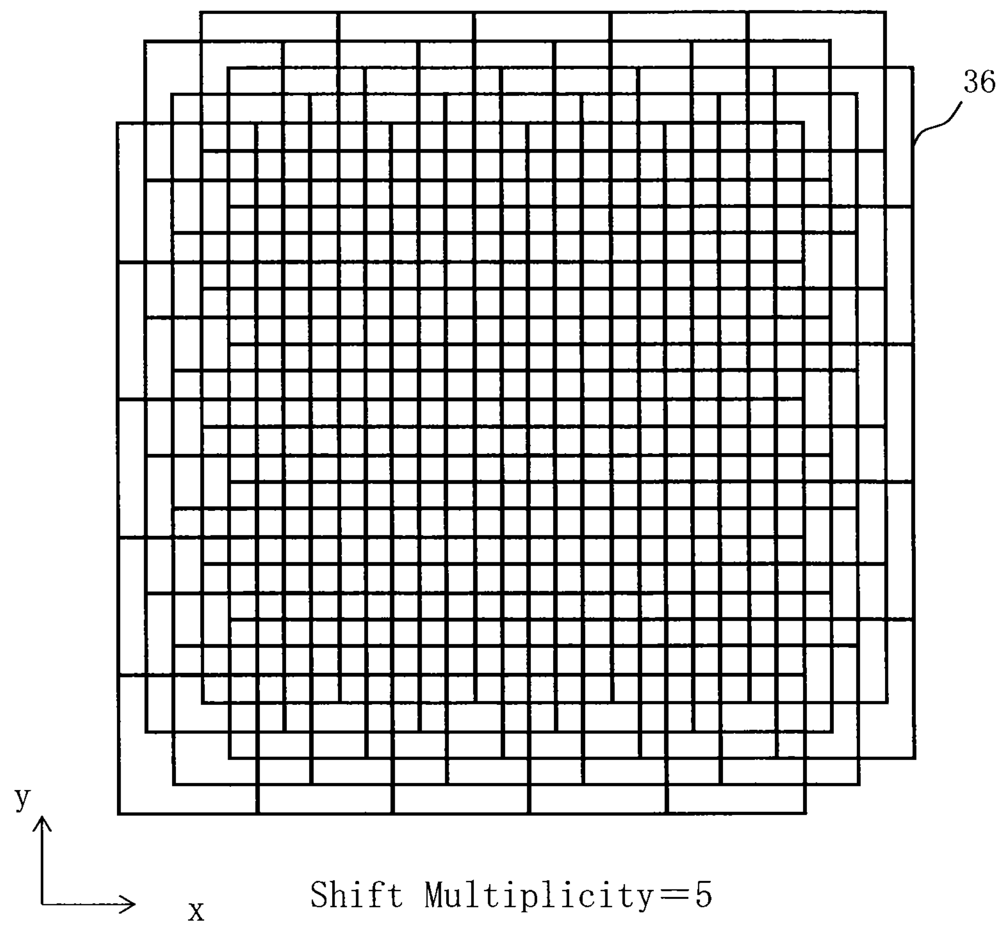
FIG. 11 shows an example of a pixel layer in the case of the shift multiplicity N=5 according to the first embodiment.

FIG. 11 shows an example of a pixel layer in the case of the shift multiplicity N=5 according to the first embodiment. FIG. 11 shows the case of the multiple writing with the shift multiplicity N=5, where, after the first writing, the position is shifted in the x direction by ⅖ pixel and in the y direction by ⅕ pixel to perform the second writing, after the second writing, it is shifted in the x direction by ⅖ pixel and in the y direction by ⅕ pixel to perform the third writing, after the third writing, it is shifted in the −x direction by ⅗ pixel and in the y direction by ⅕ pixel to perform the fourth writing, and, after the fourth writing, it is shifted in the x direction by ⅖ pixel and in the y direction by ⅕ pixel to perform the fifth writing.

In the enlarged pattern formation step (S108), the enlarged pattern forming unit 56 forms the enlarged pattern 42 by enlarging the figure pattern 40, being a writing target, depending upon the shift number "m". Specifically, the enlarged pattern forming unit 56 forms the enlarged pattern 42 by shifting the line (straight line obtained by extending each side) passing through the two vertices at both the ends of each side of the figure pattern 40 in an enlarging direction based on a calculated shift direction and a calculated shift amount, and forming a figure surrounded by these straight lines.

In the reduced pattern formation step (S110), the reduced pattern forming unit 58 forms a reduced pattern by reducing the figure pattern 40, depending upon the shift number "m".

Figure 12:
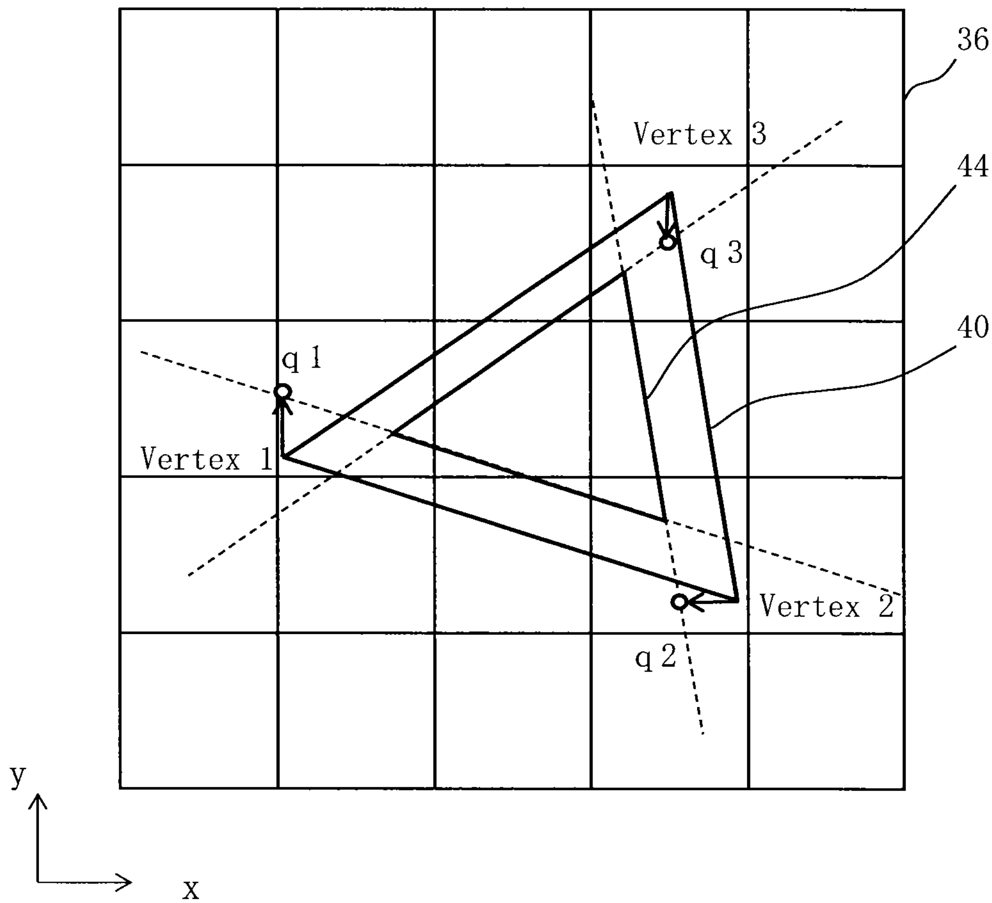
FIG. 12 illustrates a method for forming a reduced figure pattern according to the first embodiment.

FIG. 12 illustrates a method for forming a reduced figure pattern according to the first embodiment. A reduced figure pattern 44 shown in FIG. 12 is an example of reduction of the figure pattern 40 of a triangle with the vertices 1, 2, and 3 being the same as those of FIG. 7. In FIG. 12, the side t1, side t2, and side t3 are sides of the reduced figure pattern 44. The side t1 is on the straight line which is parallel to the side connecting the vertices 1 and 2, and passes through the point q1. The side t2 is on the straight line which is parallel to the side connecting the vertices 2 and 3, and passes through the point q2. The side t3 is on the straight line which is parallel to the side connecting the vertices 3 and 1, and passes through the point q3. The arrows extending from the vertices 1, 2, and 3 in the figure show arrangement directions from the vertex 1 to the point q1, from the vertex 2 to the point q2, and from the vertex 3 to the point q3. The arrangement direction from the vertex 1 to the point q1 is the direction opposite to the arrangement direction from the vertex 1 to the point p1 calculated with reference to FIG. 7. Therefore, in the case of FIG. 12, the point q1 is arranged in +y direction from the vertex 1.

Similarly, the arrangement direction from the vertex 2 to the point q2 is the direction opposite to the arrangement direction from the vertex 2 to the point p2 calculated with reference to FIG. 7. Therefore, in the case of FIG. 12, q2 is arranged in −x direction from the vertex 2.

Similarly, the arrangement direction from the vertex 3 to the point q3 is the direction opposite to the arrangement direction from the vertex 3 to the point p3 calculated with reference to FIG. 7. Therefore, in the case of FIG. 12, q3 is arranged in −y direction from the vertex 3.

As to the shift amount "s", it has already been calculated by the equation (1). Therefore, the reduced pattern forming unit 58 forms the reduced pattern 44 by shifting the line (straight line obtained by extending each side) passing through the two vertices at both the ends of each side of the figure pattern 40 in a reducing direction based on a calculated shift direction (opposite to an enlarging direction) and a calculated shift amount, and forming a figure surrounded by these straight lines.

Then, it returns to the figure pattern setting step (S102), and repeats the steps from the figure pattern setting step (S102) to the reduced pattern formation step (S110) with respect to all the figure patterns defined in writing data. This loop processing is preferably performed for each stripe region 35. An enlarged pattern and a reduced pattern are formed by the process described above for each figure pattern.

In the pass setting step (S111), the setting unit 71 sets passes for multiple writing performed while shifting the position. For example, in the case of the multiplicity (shift multiplicity) N=2 in the multiple writing performed while shifting the position, the first writing processing is set as a pass 1, and the second writing processing is set as a pass 2 whose position has been shifted. In that case, the setting unit 71 generates a pixel layer for the pass 2 whose position has been shifted. Regarding the shift amount, it should be shifted, for example, by ½ pixel as described above.

In the determination step (S112), the determination unit 60 determines for each pixel 36, using the pixel layer of the pass concerned, whether the representation position (e.g. the center) of the pixel 36 concerned is located outside (or on the line of) the enlarged pattern 42 of one of figure patterns, located inside (or on the line of) the reduced pattern 44 of the figure pattern concerned, or located in other place (between the reduced pattern 44 and the enlarged pattern 42 of the figure pattern concerned).

Figure 13:
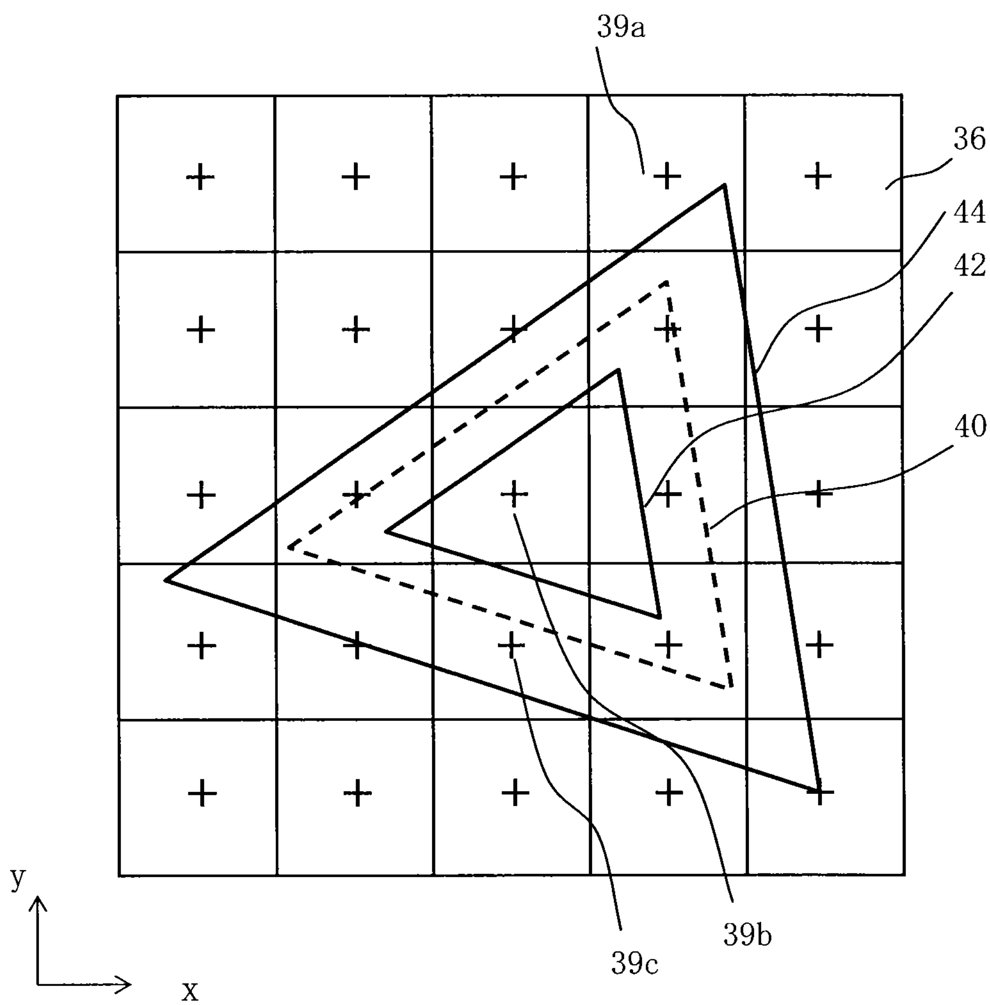
FIG. 13 shows an example of an arrangement relation between a pixel and a figure pattern according to the first embodiment.

FIG. 13 shows an example of an arrangement relation between a pixel and a figure pattern according to the first embodiment. In FIG. 13, with regard to the pixel whose representation position is 39*a*, it is determined that the representation position 39*a* is located outside the enlarged pattern 42 of the figure pattern. With regard to the pixel whose representation position is 39*b*, it is determined that the representation position 39*b* is located inside the reduced pattern 44 of the figure pattern. With regard to the pixel whose representation position is 39*c*, it is determined that the representation position 39*c* is located between the reduced pattern 44 and the enlarged pattern 42 of the figure pattern.

In the irradiation coefficient calculation step (S113), the irradiation coefficient calculation unit 62 calculates, using the enlarged pattern 42 and the reduced pattern 44, an irradiation coefficient "k" for modulating the dose of an electron beam irradiating each of a plurality of pixels 36 (small regions) which are obtained by dividing the writing region into meshes. Here, when the representation position (e.g. the center) of the pixel 36 concerned is located inside the reduced pattern 44, the irradiation coefficient calculation unit 62 calculates, for each pixel 36, the irradiation coefficient "k" to be 1. When the representation position of the pixel 36 concerned is located outside the enlarged pattern 42, the irradiation coefficient calculation unit 62 calculates, for each pixel 36, the irradiation coefficient "k" to be 0. Moreover, when the representation position of the pixel 36 concerned is located between the enlarged pattern 42 and the reduced pattern 44, the irradiation coefficient calculation unit 62 calculates, for each pixel 36, the irradiation coefficient "k" by using a function "f", (that is k=f). Specifically, when the representation position of the pixel 36 concerned is located both inside the enlarged pattern 42 and outside the reduced pattern 44, the irradiation coefficient calculation unit 62 calculates, for each pixel 36, the irradiation coefficient "k" by using the shift number "m".

Figures 14A, 14B, 14C:
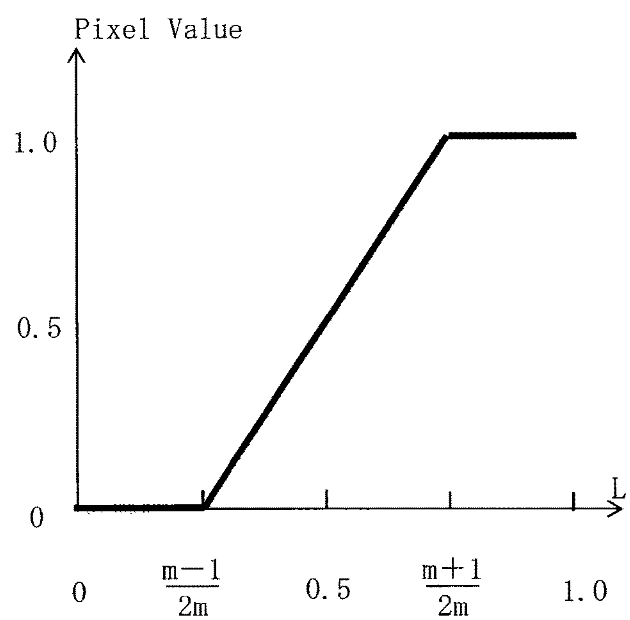
FIGS. 14A to 14C show an example of a method of calculating a value of an irradiation coefficient according to the first embodiment.

FIGS. 14A to 14C show an example of a method of calculating a value of an irradiation coefficient according to the first embodiment. As shown in FIG. 14A, the function "f" is defined using a distance L (LX or LY) with a sign from the object pixel to the side of the original figure pattern 40, and the shift number "m". When the distance L, with a sign, of the pixel 36 concerned is less than or equal to (m−1)/(2m), the function "f" is defined to be "f"=0. When the distance L, with a sign, of the pixel 36 concerned is greater than or equal to (m+1)/(2m), the function "f" is defined to be "f"=1. When the distance L, with a sign, of the pixel 36 concerned is greater than (m−1)/(2m) and less than (m+1)/(2m), the function "f" is defined to be "f"=(mL−(m−1)/2). The relation between the shift number "m" and the shift multiplicity described above is shown in FIG. 14B. The value of the function "f" varies according to the distance L, with a sign, of the pixel 36 concerned as shown in FIG. 14C. When the distance L, with a sign, of the pixel 36 concerned is between (m−1)/(2m) and (m+1)/(2m), the value of the function "f" increases in linear proportion.

Figure 15:
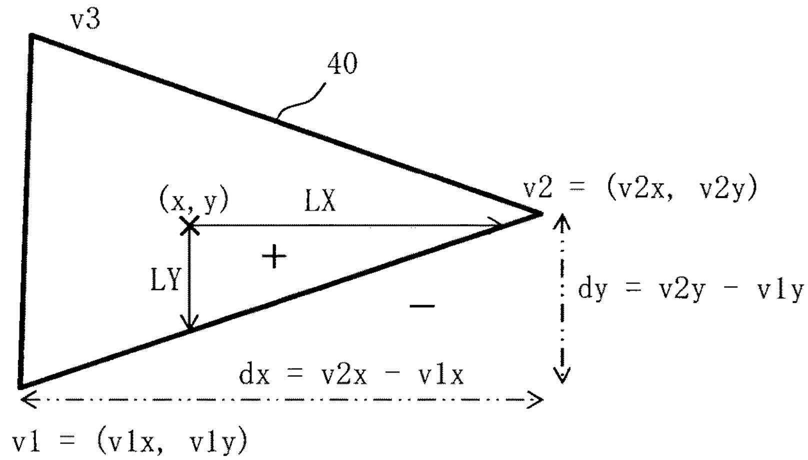
FIG. 15 illustrates a method of calculating a distance with a sign according to the first embodiment.

FIG. 15 illustrates a method of calculating a distance with a sign according to the first embodiment. As shown in FIG. 15, the distance from the coordinates (x, y) of the representation position (for example, the center) of the object pixel 36 to the side of the figure pattern 40 is calculated including signs. In the case of FIG. 15, a triangular figure pattern 40 is shown, for example. Coordinates of the three vertices of the figure pattern 40 are defined as v1, v2, and v3. The coordinates of v1 are (v1x, v1y), coordinates of v2 are (v2x, v2y), and coordinates of v3 are (v3x, v3y). The equation of the straight line L12 passing through the vertices v1 and v2 can be defined by the following equation (2).

$$dx(y-v1y)=dy(y-v1x), \quad (2)$$

where dx=v2x−v1x and dy=v2y−v1y.

Using the equation (2), the equation FL12 (x, y) of the line L12 connecting the vertices v1 and v2 is rewritten as the following equation (3).

$$\mathrm{FL12}(x,y)=dy(y-v1x)-dx(y-v1y) \quad (3)$$

When substituting the representation position (x, y) of the object pixel 36 into the equation (3), if the sign of FL12 (x, y) is negative, it means that the representation position (x, y) is located outside the side connecting the vertices v1 and v2 of the figure pattern 40, (that is, outside the figure pattern 40). On the contrary, if the sign of FL12 (x, y) is positive, it means that the representation position (x, y) is located inside the side connecting the vertices v1 and v2 of the figure pattern 40, (that is, inside the figure pattern 40). Therefore, after performing similar calculation for each side, if all the signs are positive, it means that the representation position (x, y) is inside the figure pattern 40.

Regarding the distance L with a sign, along the x and y axes, from the representation position (x, y) of the object pixel 36 to the straight line L12, the distance LY with a sign along the y-axis is defined by the following equation (4-1), and the distance LX with a sign along the x-axis is defined by the following equation (4-2).

$$LY(x,y)=y-v1y-(dy/dx)(x-v1x) \quad (4\text{-}1)$$

$$LX(x,y)=x-v1x-(dx/dy)(y-v1y) \quad (4\text{-}2)$$

Figure 16A:
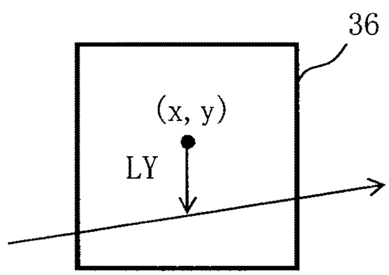
FIGS. 16A and 16B illustrate another method of calculating a distance with a sign according to the first embodiment.
Figure 16B:
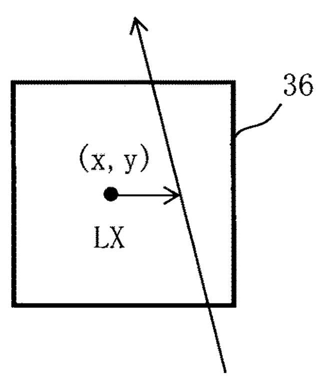

FIGS. 16A and 16B illustrate another method of calculating a distance with a sign according to the first embodiment. As shown in FIG. 16A, the distance LY with a sign, along the y-axis, from the representation position (x, y) of the object pixel 36 to a certain straight line can be defined by the following equation (5-1) using the equation (3). As shown in FIG. 16B, the distance LX with a sign, along the x-axis, from the representation position (x, y) of the object pixel 36 to a certain straight line can be defined by the following equation (5-2) using the equation (3).

$$LY(x,y)=\mathrm{FL12}(x,y)/dx \quad (5\text{-}1)$$

$$LX(x,y)=\mathrm{FL12}(x,y)/dy \quad (5\text{-}2)$$

In the calculation of the function "f", either one of LX and LY, having a smaller absolute value, is used as the distance L with a sign.

Figure 17A:
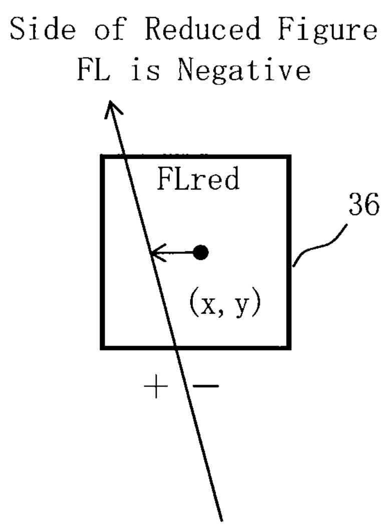
FIGS. 17A and 17B show another example method of calculating the value of an irradiation coefficient according to the first embodiment.
Figure 17B:
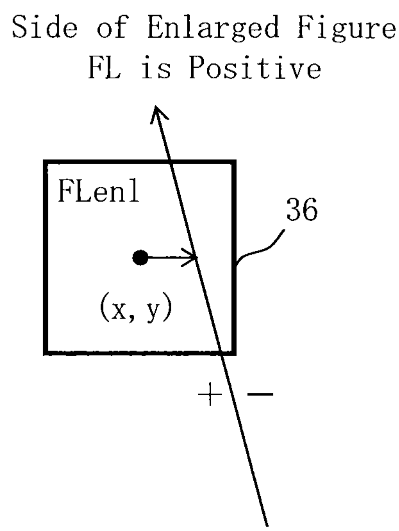

FIGS. 17A and 17B show another example method of calculating the value of an irradiation coefficient according to the first embodiment. In FIGS. 17A and 17B, it is assumed that the representation position (for example, the center) of the pixel 36 is located both outside the reduced pattern 44 and inside the enlarged pattern 42. If the representation position (for example, the center) of the pixel 36 is located inside the reduced pattern 44, the irradiation coefficient is regarded as 1, and if it is located outside the enlarged pattern 42, the irradiation coefficient is regarded as 0, which is similar to that described above. When substituting the representation position (x, y) of the object pixel 36 into the equation FL12 (x, y) concerning the straight line L12, which is a side of the reduced pattern 44, as shown in FIG. 17A, the value (FLred(x, y)) of the equation FL12 (x, y) concerning the straight line L12, which is the side of the reduced pattern 44, is negative. On the other hand, when substituting the representation position (x, y) of the object pixel 36 into the equation FL12 (x, y) concerning the straight line L12, which is a side of the enlarged pattern 42, as shown in FIG. 17B, the value (FLen1(x, y)) of the equation FL12 (x, y) concerning the straight line L12, which is the side of the enlarged pattern 42, is positive. Then, when the representation position of the pixel 36 is located between the enlarged pattern 42 and the reduced pattern 44, the irradiation coefficient "k" is defined by using the function "f". In that case, the function "f" can be defined by the following equation (6).

$$k=f=m\cdot(\mathrm{FLen1}(x,y)-\mathrm{FLred}(x,y))/\max\cdot(|dx|,|dy|) \quad (6)$$

Regarding dx and dy, they are calculated for each of the enlarged pattern 42 and the reduced pattern 44. max·(|dx|, |dy|) means the largest value of the absolute value of dx and the absolute value of dy in each case of the enlarged pattern 42 and the reduced pattern 44.

In the irradiation coefficient map generation step (S114), the "k" map generation unit 64 generates, for each pass, an irradiation coefficient "k" map for the pass concerned. The irradiation coefficient "k" map is preferably generated for each stripe region 35. The generated irradiation coefficient map is stored in the storage device 142.

In the dose map generation step (S120), the dose map generation unit 72 calculates, for each pass, the dose of each pixel and generates a dose map. Specifically, it operates as described below. The dose map generation unit 72 reads writing data from the storage device 140 and calculates the area density ρ of a pattern arranged in each of a plurality of mesh regions obtained by virtually dividing the writing region of the target object 101 or a chip region to be written into meshes. The mesh region used for calculating the area density ρ does not need to coincide with a pixel. For example, the size of the mesh region is preferably about 1/10 of the influence radius of the proximity effect, such as about 1 μm. In calculating in consideration of a fogging effect or a loading effect, a further larger size will be preferable. On the other hand, since the pixel size is, for example, the beam size (on the order of several tens of nm), the mesh region is generally larger than a pixel. A correction irradiation coefficient Dp for correcting, depending on a dose, a dimension variation amount with respect to a phenomenon causing dimension variations, such as a proximity effect, a fogging effect, and a loading effect is calculated using the area density ρ. For each pass of multiple writing performed while shifting the position, the area density ρ' of a pattern in each pixel in the pixel layer of the pass concerned is calculated. Moreover, for each pass, the dose D(x, y) is calculated for each pixel 36, for example, by multiplying the base dose Dbase by the correction irradiation coefficient Dp(x, y), the area density ρ'(x, y), and the 1/multiplicity N. The coordinates (x, y) here indicate the position of a pixel. The value of a mesh region in which the pixel 36 concerned is located can be used as the correction irradiation coefficient Dp.

Although the dose for each pass is 1/multiplicity N as an example, it is not limited thereto. It is also preferable to make the dose for each pass variable. A dose map in which the calculated dose D(x, y) of each pixel is used as a map value is generated for each pass. The dose map is preferably generated for each stripe region 35. The generated dose map is stored in the storage device 142.

The dose map generation step (S120) may be performed in parallel with each step from the figure pattern setting step (S102) to the irradiation coefficient map generation step (S114) described above.

In the dose calculation step (S130), for each pass, the dose calculation unit 66 reads the dose map and the irradiation coefficient map for the pass concerned from the storage device 142, and calculates a dose D in the pass concerned for each pixel 36 by using the irradiation coefficient "k". Specifically, the dose D in the pass concerned is calculated by multiplying the dose in the pass concerned by the irradiation coefficient "k".

In the irradiation time map generation step (S132), for each pass, the irradiation time calculation unit 68 obtains an irradiation time t of each pixel by dividing the dose D of each pixel by a current density J. Then, an irradiation time map in which the calculated irradiation time t of each pixel is used as a map value is generated for each pass. The irradiation time map is preferably generated for each stripe region 35. The generated irradiation time map is stored in the storage device 142. The irradiation time calculation unit 68 converts the obtained irradiation time into irradiation time data of, for example, 10 bits of irradiation time resolution. The irradiation time data (shot data) is stored in the storage device 142.

In the case of there being a pass for which no irradiation time map has been generated yet, it returns to the pass setting step (S111) and repeats each step from the pass setting step (S111) to the irradiation time map generation step (S132) until irradiation time maps haven been generated for all the passes. The loop processing is preferably executed per stripe region 35. By what is described above, the irradiation time map is generated for each pass.

In the writing step (S134), under the control of the writing control unit 70, the deflection control circuit 130 reads irradiation time data from the storage device 142, and outputs, for each shot, the irradiation time data to the control circuit 41 for each beam. Then, the writing mechanism 150 writes, for each pass, a figure pattern on the target object 101 according to the multiple writing method performed while shifting the position, using an electron beam of the dose obtained for each pixel by using the irradiation coefficient "k". Specifically, the writing mechanism 150 writes, for each pass, a pattern on the target object 101, using the multi-beams 20 which includes a beam corresponding to the calculated irradiation time t. The order of writing is proceeded in accordance with the writing sequence controlled by the writing control unit 70. Each pass may be switched (changed) per stripe region, or switched (changed) for each shot. The writing time can be shortened by switching (changing) the pass for each shot.

FIGS. 18A to 18E illustrate a case of a beam dose profile of when writing a figure pattern, whose edge does not coincide with the pixel boundary, by the method of multiple writing with the shift multiplicity N=2 according to the first embodiment and comparative examples. In FIG. 18A, the pixel layer of the first layer (L=1) (first pass), the pixel layer of the second layer (L=2) (second pass), and a figure pattern 48*a* overlap with each other. FIG. 18A shows a figure pattern whose edge does not coincide with the boundary of the pixel 36. In the case of FIG. 18A, writing of the second pass is performed at the position shifted in the x and y directions each by ½ pixel from the position of the pixel layer of the first pass. FIG. 18B shows a sectional view of the figure pattern 48*a*. FIG. 18C shows, according to comparative example 1, an example of a beam dose profile in the case of writing the first and second passes by the method of simply proportioning the beam dose to the pattern area density in a pixel. FIG. 18D shows, according to comparative example 2, an example of a beam dose profile in the case of writing the first and second passes by the method in which it is irradiated by a beam with the dose of 100% when the central point of a pixel is in the pattern and it is not irradiated by beam when the central point is not in the pattern. FIG. 18E shows an example of a beam dose profile in the case of writing the first pass and the second pass by the method according to the first embodiment. In the comparative example 1, irradiation is performed if a figure pattern, even if only a small part of it, overlaps with a pixel. Accordingly, the gradient of the dose profile of a beam becomes small, and therefore, the contrast is degraded. Thus, it becomes difficult to develop the resist in a manner to achieve a highly precise position and critical dimension. On the other hand, according to the comparative example 2 and the first embodiment, the gradient of the dose profile of a beam does not become small, and therefore contrast degradation can be inhibited.

Figures 19A, 19B, 19C, 19D, 19E:
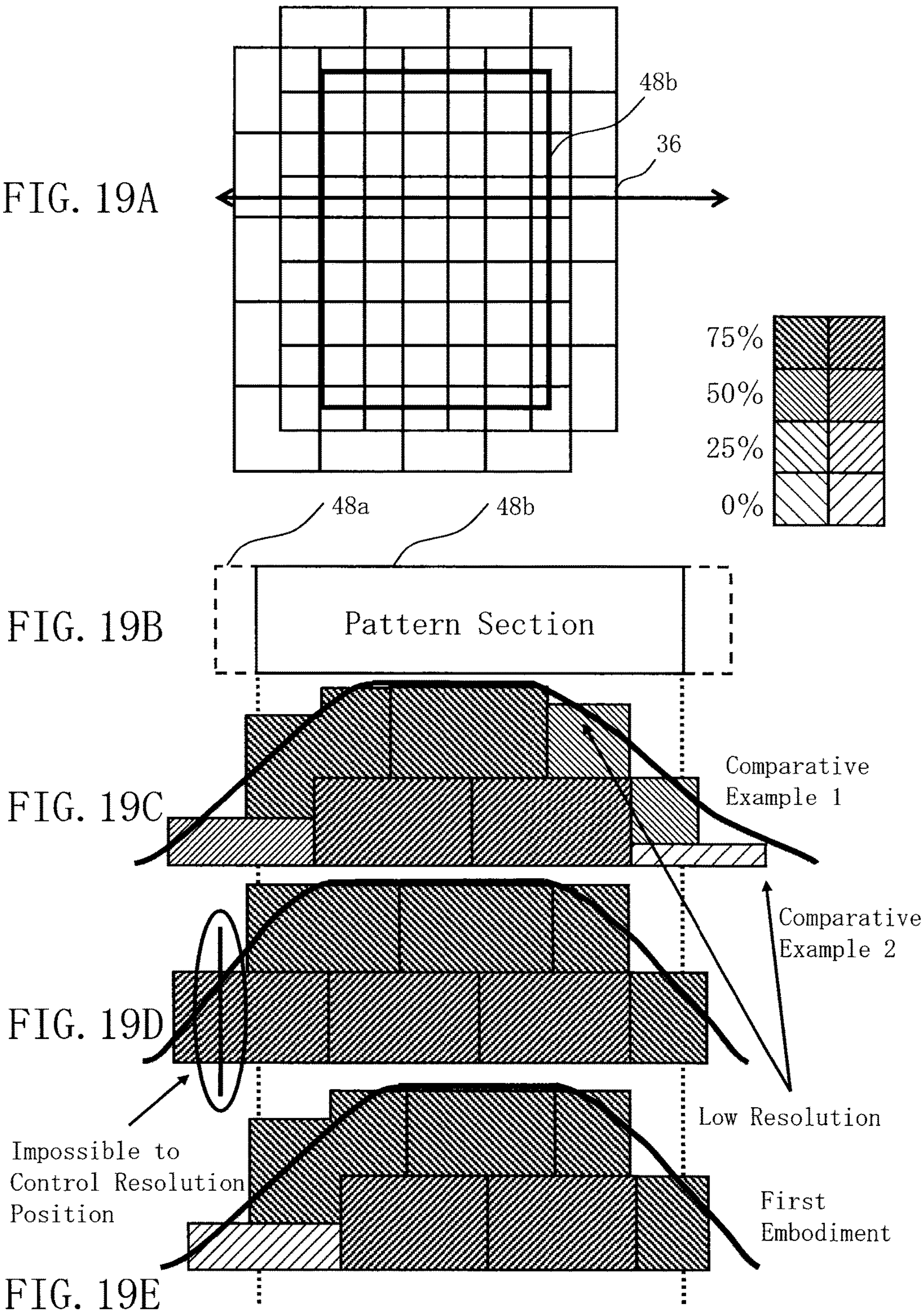
FIGS. 19A to 19E illustrate another case of a beam dose profile of when writing a figure pattern, whose edge does not coincide with the pixel boundary, by the method of multiple writing with the shift multiplicity N=2 according to the first embodiment and comparative examples.

FIGS. 19A to 19E illustrate another case of a beam dose profile of when writing a figure pattern, whose edge does not coincide with the pixel boundary, by the method of multiple writing with the shift multiplicity N=2 according to the first embodiment and comparative examples. In FIG. 19A, the pixel layer of the first layer (L=1) (first pass), the pixel layer of the second layer (L=2) (second pass), and a figure pattern 48*b* overlap with each other. FIG. 19A shows the figure pattern 48*b* obtained by diminishing the left end of the figure pattern 48*a* by ¼ pixel to be coincident with the boundary of the pixel 36, and diminishing the right end of the figure pattern 48*a* by ½ pixel. In the case of FIG. 19A, writing of the second pass is performed at the position shifted in the x and y directions each by ½ pixel from the position of the pixel layer of the first pass. FIG. 19B shows a sectional view of the figure pattern 48*b*. FIG. 19C shows, according to comparative example 1, an example of a beam dose profile in the case of writing the first and second passes by the method of simply proportioning the beam dose to the pattern area density in a pixel. FIG. 19D shows, according to comparative example 2, an example of a beam dose profile in the case of writing the first and second passes by the method in which it is irradiated by a beam with the dose of 100% when the central point of a pixel is in the pattern and it is not irradiated by beam when the central point is not in the pattern. FIG. 19E shows an example of a beam dose profile in the case of writing the first pass and the second pass by the method according to the first embodiment. In the comparative example 2, when the position of the pixel boundary and the position of the pattern edge do not coincide with each other as in the case of the second pass, since the resolution position of the resist deviates, it is difficult in the first place to increase the pattern edge accuracy. On the other hand, according to both the comparative example 1 and the first embodiment, the resolution position of the resist can be coincident with the position of the pattern edge.

As described above, according to the first embodiment, it is possible to overcome the disadvantages of the comparative examples 1 and 2.

Figure 20:
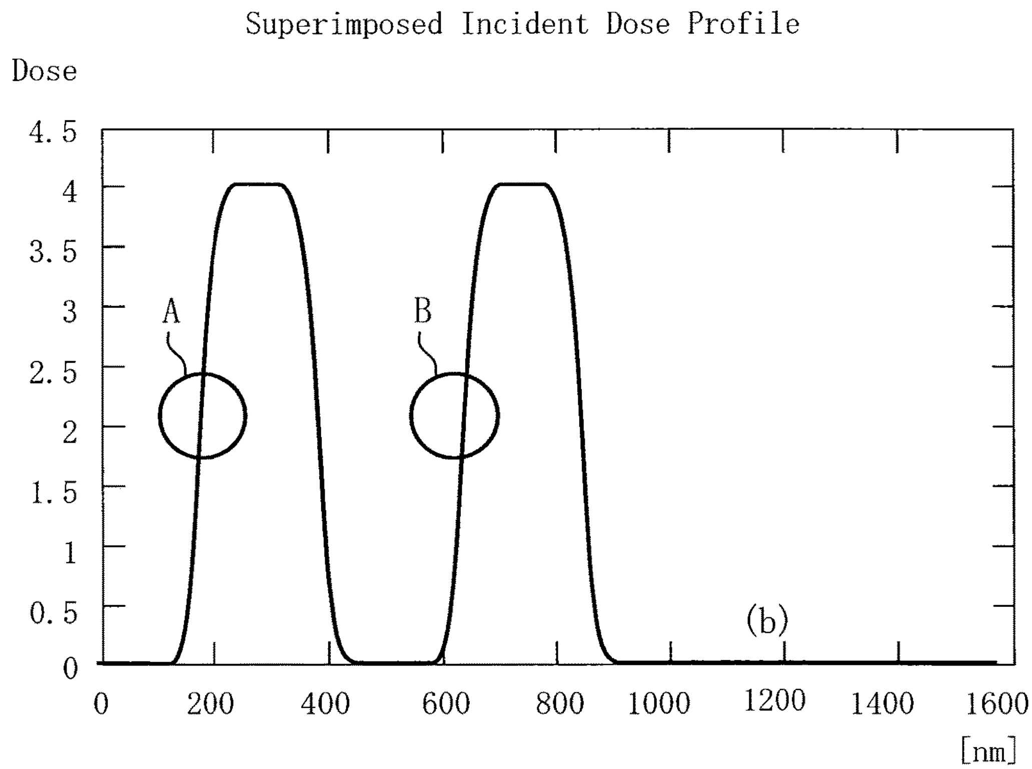
FIG. 20 shows examples of an incident dose profile for describing the effect of controlling the figure edge of a quadrangular pattern according to the first embodiment.

FIG. 20 shows examples of an incident dose profile for describing the effect of controlling the figure edge of a quadrangular pattern according to the first embodiment. In FIG. 20, the abscissa represents a position and the ordinate represents a dose. FIG. 20 shows the case of writing two quadrangular patterns whose positions are displaced from each other. Concerning the quadrangular pattern on the left side, shown is a graph generated by superimposing incident dose profiles obtained by writing while shifting ten times the position of the edge by 1 nm. Concerning the quadrangular pattern on the right side, shown is a graph generated by superimposing incident dose profiles obtained by writing while shifting ten times the position of the edge by 0.1 nm.

Figure 21A:
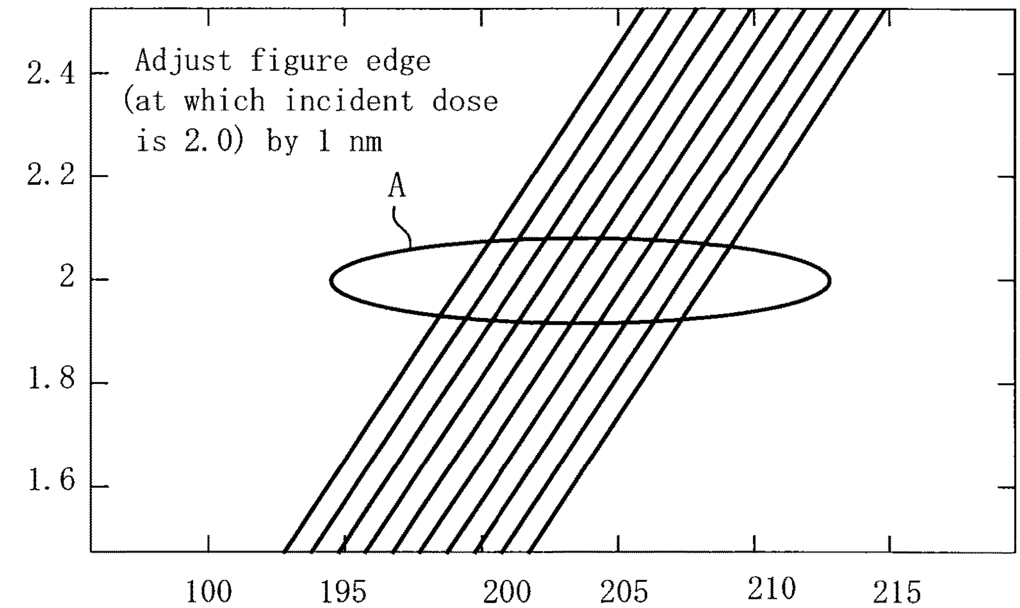
FIGS. 21A and 21B show enlarged views obtained by partly enlarging examples of an incident dose profile, for describing the effect of controlling the figure edge of a quadrangular pattern according to the first embodiment.
Figure 21B:
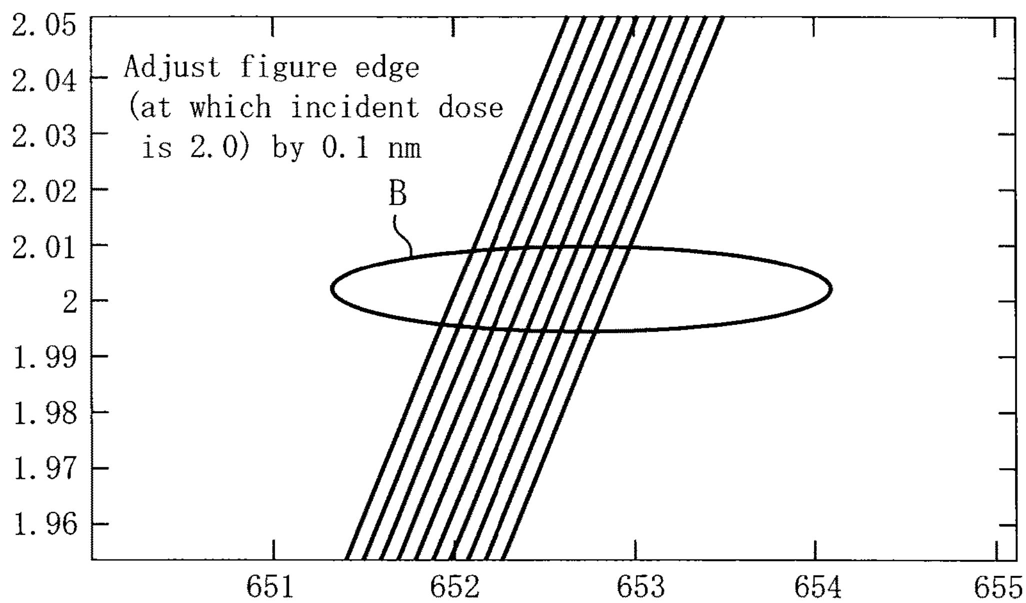

FIGS. 21A and 21B show enlarged views obtained by partly enlarging examples of an incident dose profile, for describing the effect of controlling the figure edge of a quadrangular pattern according to the first embodiment. FIG. 21A shows an enlarged portion of the part A of the incident dose profile of the quadrangular pattern on the left side in FIG. 20. FIG. 21B shows an enlarged portion of the part B of the incident dose profile of the quadrangular pattern on the right side in FIG. 20. According to the first embodiment, it is possible not only to control the position of the figure edge of a quadrangular pattern by 1 nm as shown in FIG. 21A, but also to control the position of the figure edge of it by 0.1 nm as shown in FIG. 21B.

Figure 22:
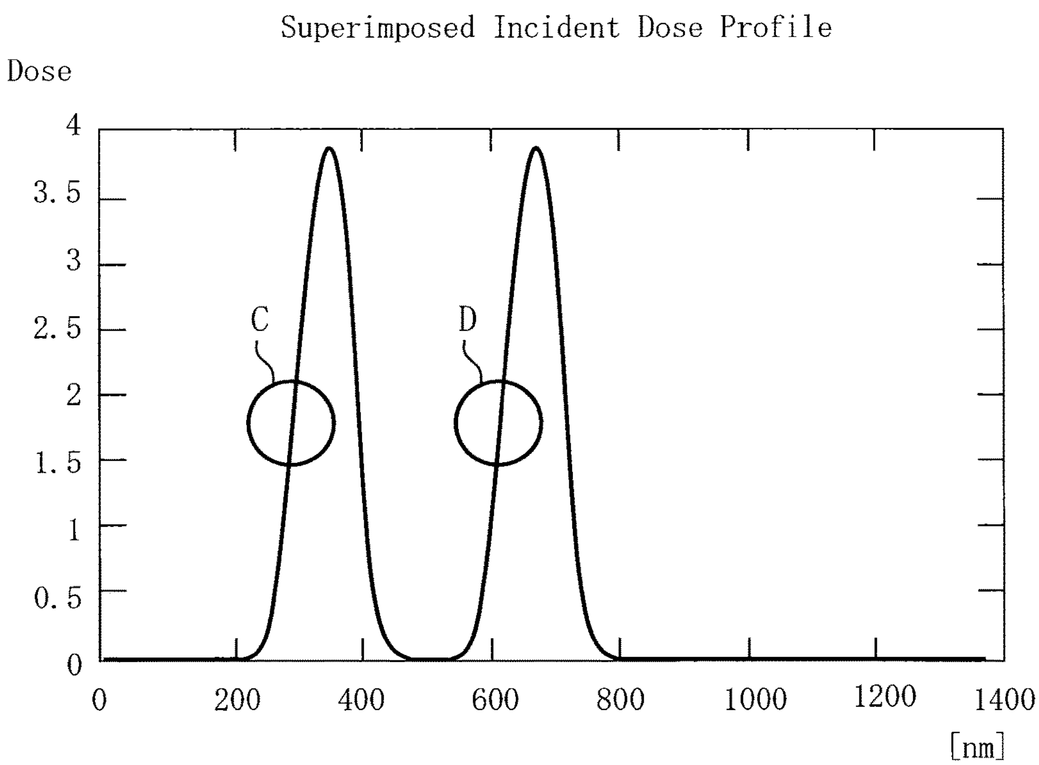
FIG. 22 shows examples of an incident dose profile for describing the effect of controlling the figure edge of a triangular pattern according to the first embodiment.

FIG. 22 shows examples of an incident dose profile for describing the effect of controlling the figure edge of a triangular pattern according to the first embodiment. In FIG. 22, the abscissa represents a position and the ordinate represents a dose. FIG. 22 shows the case of writing two triangular patterns whose positions are displaced from each other. Concerning the triangular pattern on the left side, shown is a graph generated by superimposing incident dose profiles obtained by writing while shifting five times the position of the edge of the slanting line in the x direction by 1 nm. Concerning the triangular pattern on the right side, shown is a graph generated by superimposing incident dose profiles obtained by writing while shifting five times the position of the edge of the slanting line in the x direction by 0.1 nm.

Figure 23A:
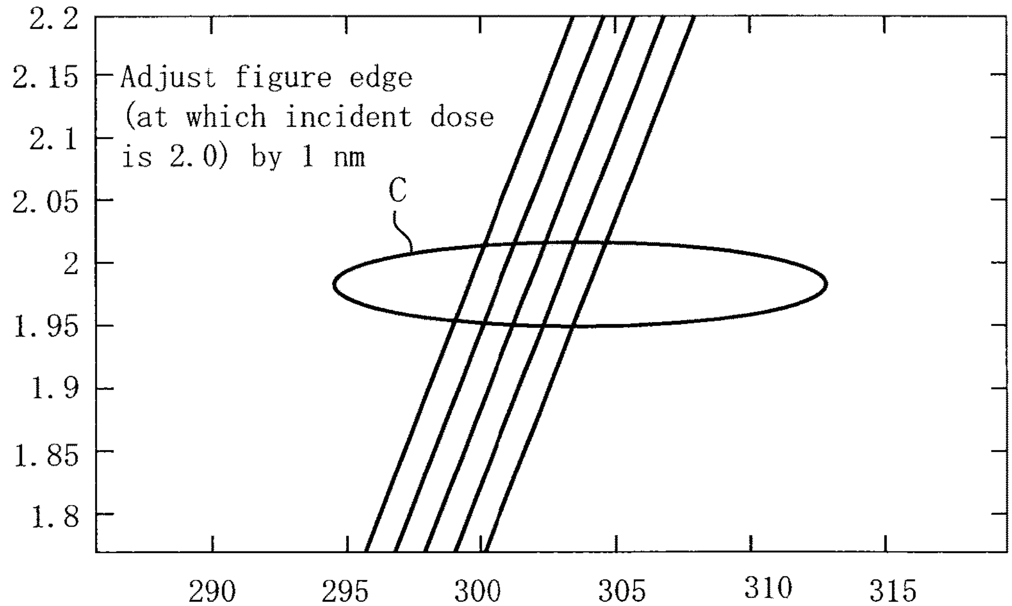
FIGS. 23A and 23B show enlarged views obtained by partly enlarging examples of an incident dose profile, for describing the effect of controlling the figure edge of a triangular pattern according to the first embodiment.
Figure 23B:
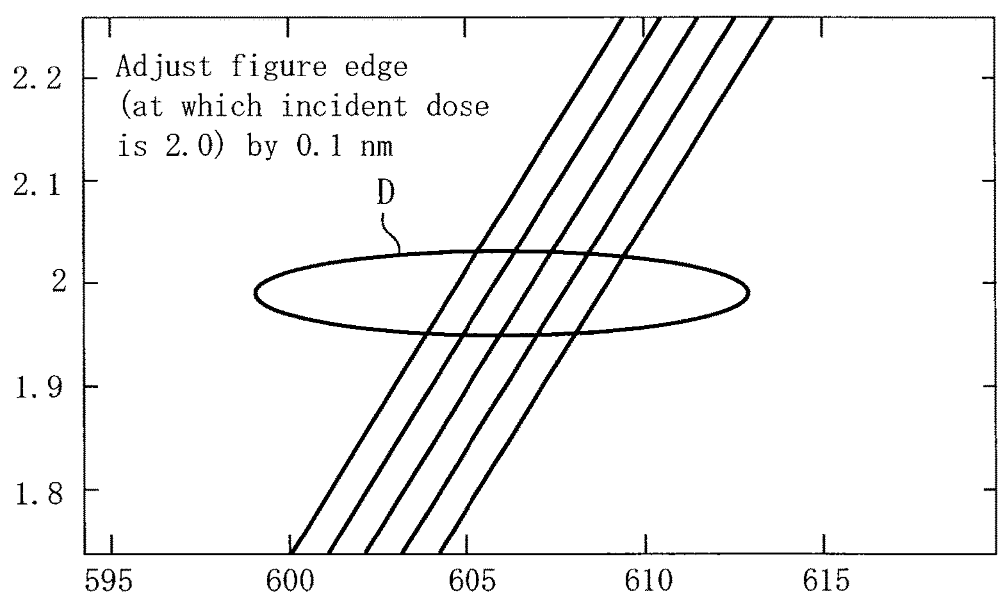

FIGS. 23A and 23B show enlarged views obtained by partly enlarging examples of an incident dose profile, for describing the effect of controlling the figure edge of a triangular pattern according to the first embodiment. FIG. 23A shows an enlarged portion of the part C of the incident dose profile of the triangular pattern on the left side in FIG. 22. FIG. 23B shows an enlarged portion of the part D of the incident dose profile of the triangular pattern on the right side in FIG. 22. According to the first embodiment, it is possible not only to control the position of the figure edge of a triangular pattern by 1 nm as shown in FIG. 23A, but also to control the position of the figure edge of it by 0.1 nm as shown in FIG. 23B.

Figure 24:
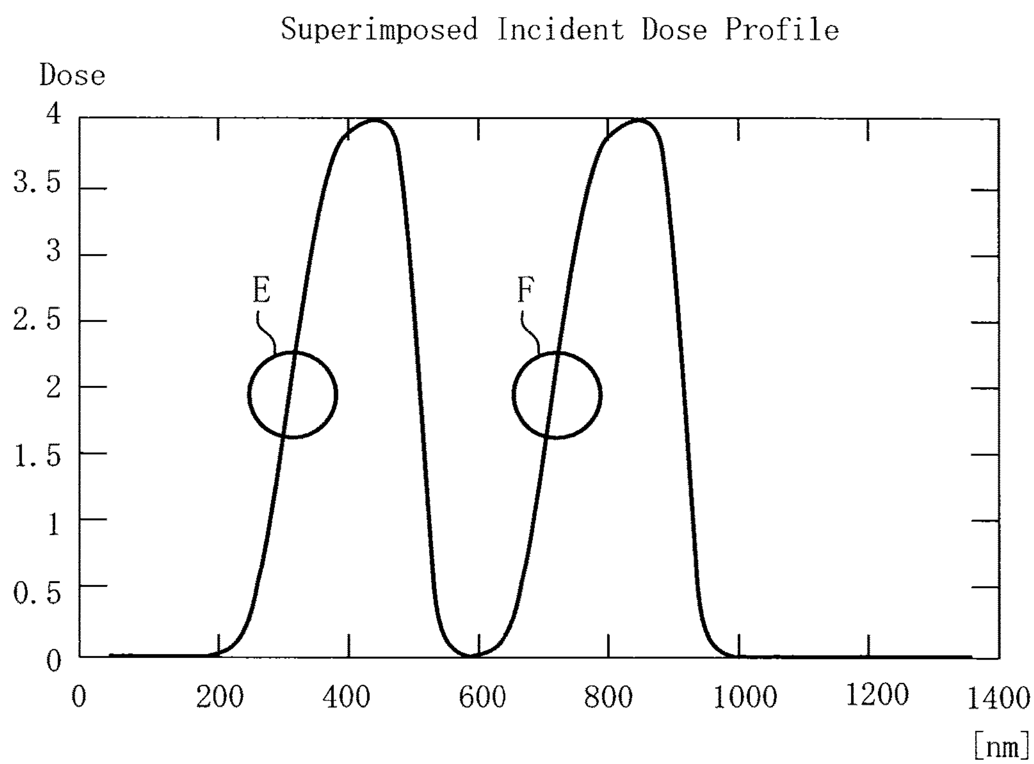
FIG. 24 shows examples of an incident dose profile for describing the effect of controlling the figure edge of an optionally angled triangular pattern according to the first embodiment.

FIG. 24 shows examples of an incident dose profile for describing the effect of controlling the figure edge of an optionally angled triangular pattern according to the first embodiment. In FIG. 24, the abscissa represents a position and the ordinate represents a dose. FIG. 24 shows the case of writing two optionally angled triangular patterns (in this case 30°) whose positions are displaced from each other. Concerning the optionally angled triangular pattern on the left side, shown is a graph generated by superimposing incident dose profiles obtained by writing while shifting five times the position of the edge of the slanting line in the x direction by 1 nm. Concerning the optionally angled triangular pattern on the right side, shown is a graph generated by superimposing incident dose profiles obtained by writing while shifting five times the position of the edge of the slanting line in the x direction by 0.1 nm.

Figure 25A:
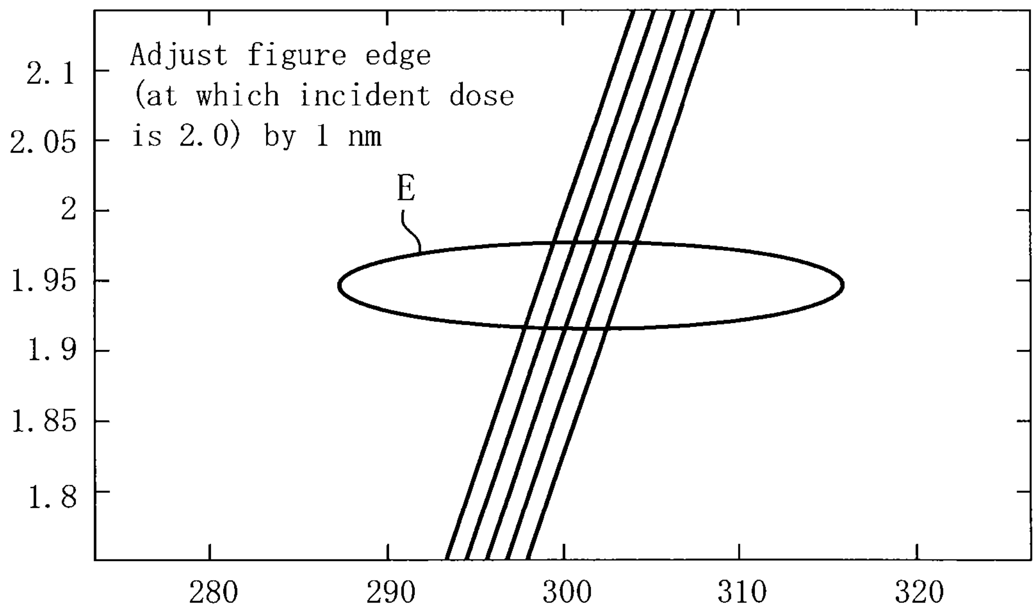
FIGS. 25A and 25B show enlarged views obtained by partly enlarging examples of an incident dose profile, for describing the effect of controlling the figure edge of an optionally angled triangular pattern according to the first embodiment.
Figure 25B:
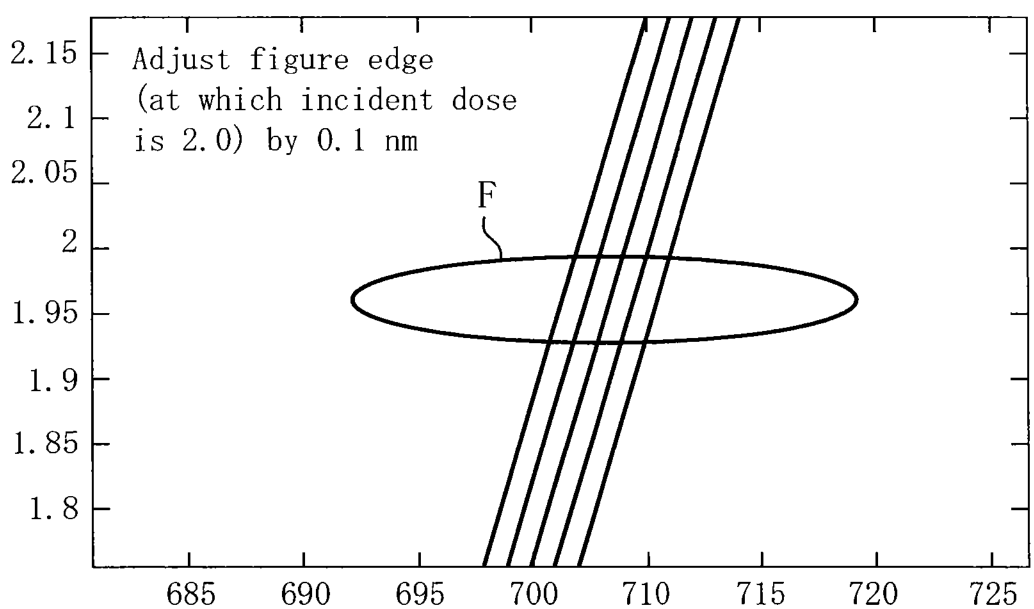

FIGS. 25A and 25B show enlarged views obtained by partly enlarging examples of an incident dose profile, for describing the effect of controlling the figure edge of an optionally angled triangular pattern according to the first embodiment. FIG. 25A shows an enlarged portion of the part E of the incident dose profile of the optionally angled triangular pattern on the left side in FIG. 24. FIG. 25B shows an enlarged portion of the part F of the incident dose profile of the optionally angled triangular pattern on the right side in FIG. 24. According to the first embodiment, it is possible not only to control the position of the figure edge of an optionally angled triangular pattern (in this case 30°) by 1 nm as shown in FIG. 25A, but also to control the position of the figure edge of it by 0.1 nm as shown in FIG. 25B.

Figure 26:
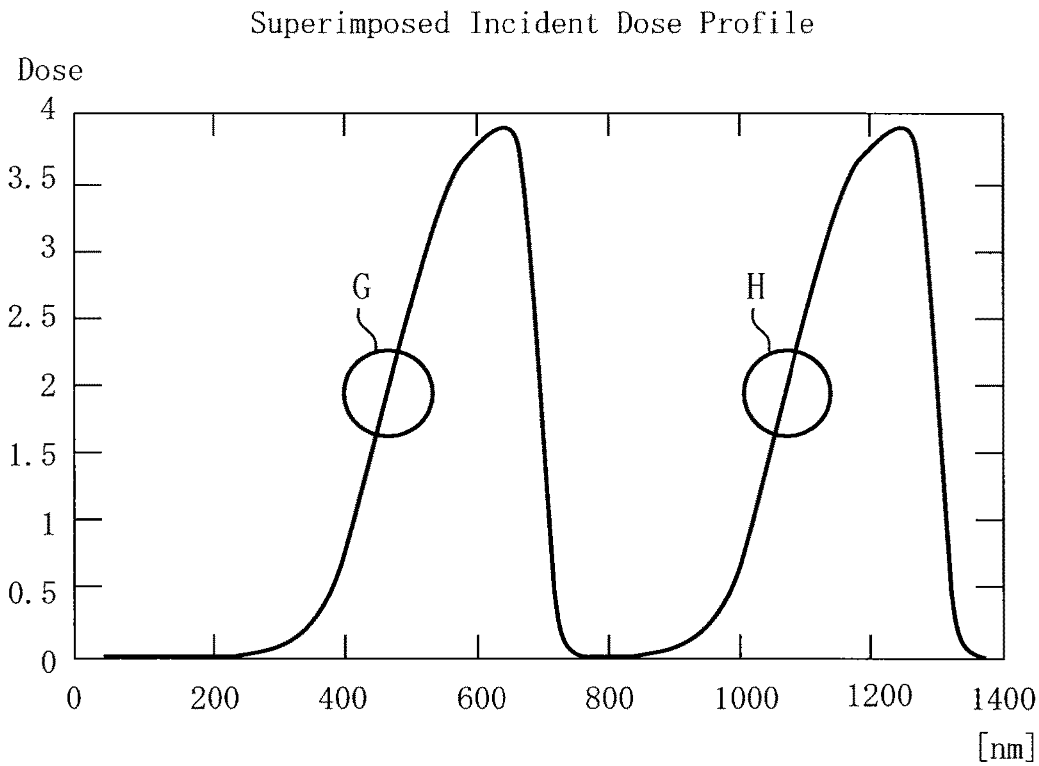
FIG. 26 shows examples of another incident dose profile for describing the effect of controlling the figure edge of an optionally angled triangular pattern according to the first embodiment.

FIG. 26 shows examples of another incident dose profile for describing the effect of controlling the figure edge of an optionally angled triangular pattern according to the first embodiment. In FIG. 26, the abscissa represents a position and the ordinate represents a dose. FIG. 26 shows the case of writing two optionally angled triangular patterns (in this case 15°) whose positions are displaced from each other. Concerning the optionally angled triangular pattern on the left side, shown is a graph generated by superimposing incident dose profiles obtained by writing while shifting five times the position of the edge of the slanting line in the x direction by 1 nm. Concerning the optionally angled triangular pattern on the right side, shown is a graph generated by superimposing incident dose profiles obtained by writing while shifting five times the position of the edge of the slanting line in the x direction by 0.1 nm.

Figure 27A:
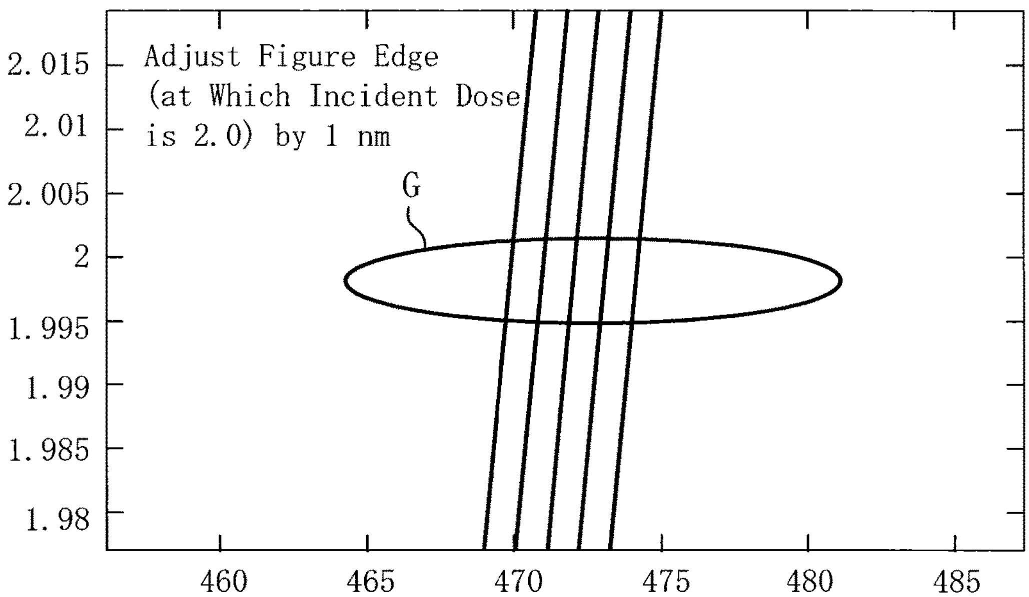
FIGS. 27A and 27B show enlarged views obtained by partly enlarging examples of another incident dose profile, for describing the effect of controlling the figure edge of an optionally angled triangular pattern according to the first embodiment.
Figure 27B:
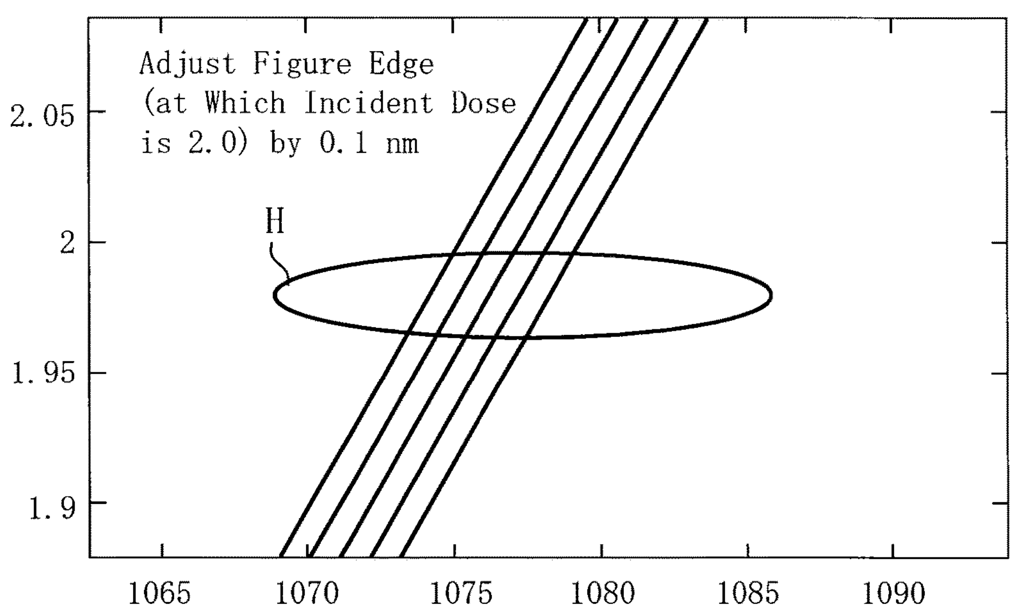

FIGS. 27A and 27B show enlarged views obtained by partly enlarging examples of another incident dose profile, for describing the effect of controlling the figure edge of an optionally angled triangular pattern according to the first embodiment. FIG. 27A shows an enlarged portion of the part G of the incident dose profile of the optionally angled triangular pattern on the left side in FIG. 26. FIG. 27B shows an enlarged portion of the part H of the incident dose profile of the optionally angled triangular pattern on the right side in FIG. 26. According to the first embodiment, it is possible not only to control the position of the figure edge of an optionally angled triangular pattern (in this case 15°) by 1 nm as shown in FIG. 27A, but also to control the position of the figure edge of it by 0.1 nm as shown in FIG. 27B.

According to the first embodiment, as described above, it is possible to write highly accurate patterns while keeping high dose contrast of incident beams in the writing method in which patterns are formed using pixel patterns.

Second Embodiment

Although, in the first embodiment, there has been described the case where the function "f" (=irradiation coefficient "k") is calculated using a shift number "m" as it is, the calculation method is not limited thereto. In the second embodiment, the case will be described where another value including the shift number "m" is used. The configuration of the writing apparatus 100 is the same as that of FIG. 1. The structure of the writing method is the same as that of FIG. 6. The contents of the second embodiment are the same as those of the first embodiment except for what is specifically described below. The contents of the figure pattern setting step (S102) and the shift direction calculation step (S104) are the same as those of the first embodiment.

Figures 28A, 28B, 28C:
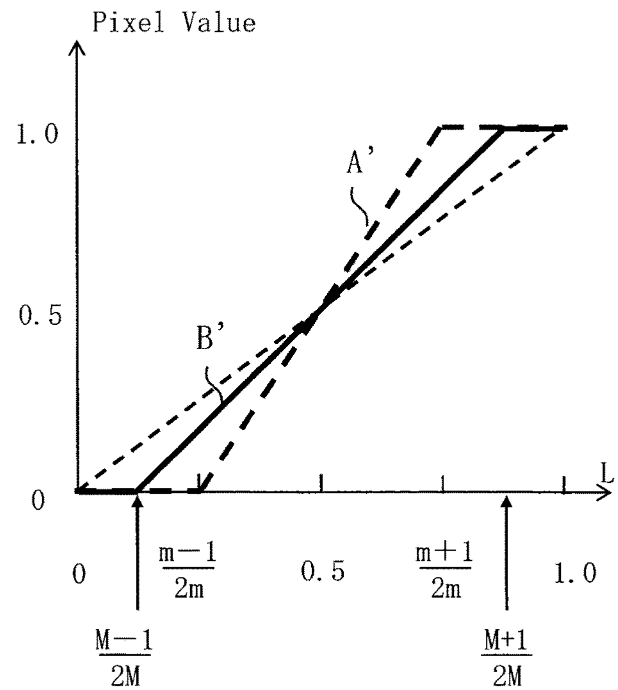
FIGS. 28A to 28C show an example of a method of calculating a value of an irradiation coefficient according to a second embodiment.

FIGS. 28A to 28C show an example of a method of calculating a value of an irradiation coefficient according to the second embodiment. As described with reference to FIG. 14C, when the shift number "m" is used as it is, the value of the function "f" varies depending on the distance L with a sign of the pixel 36 concerned as shown in the graph A' of FIG. 28C. Here, if the shift number "m" is a large value, the gradient of the graph A' is steep. In such a case, even when the distance L with a sign varies only a little, the value of the function "f" (irradiation coefficient "k") varies greatly. Therefore, according to the second embodiment, as shown in graph B', it is configured to have a gradient slower (smaller) than that of the graph A'. Accordingly, according to the second embodiment, without using the shift number "m" as it is, a value M which is less than or equal to the shift number is defined to be $1 \leq M \leq m$. Thus, a value which is less than or equal to the shift number "m" and greater than or equal to 1 is used as the value M.

In the shift amount calculation step (S106), the shift amount calculation unit 54 calculates a shift amount "s" used for enlarging the figure pattern 40 to the enlarged figure pattern 42. Specifically, the shift amount "s" is defined by the following equation (7) using the grid width "w" of the pixel 36, and the value M being less than or equal to the shift number.

$$s = w/(2 \cdot M) \tag{7}$$

In the enlarged pattern formation step (S108), the enlarged pattern forming unit 56 forms the enlarged pattern 42 by enlarging the figure pattern 40, being a writing target, depending upon the value M being less than or equal to the shift number. The concrete contents are the same as those of the first embodiment. Here, the shift amount "s" obtained by the equation (7) is used.

In the reduced pattern formation step (S110), the reduced pattern forming unit 58 forms a reduced pattern by reducing the figure pattern 40, depending upon the value M being less than or equal to the shift number. The concrete contents are the same as those of the first embodiment. Here, the shift amount "s" obtained by the equation (7) is used.

The contents of the pass setting step (S111) and the determination step (S112) are the same as those of the first embodiment.

In the irradiation coefficient calculation step (S113), the irradiation coefficient calculation unit 62 calculates, using the enlarged pattern 42 and the reduced pattern 44, an irradiation coefficient "k" for modulating the dose of an electron beam irradiating each of a plurality of pixels 36 (small regions) which are obtained by dividing the writing region into meshes. Here, when the representation position (e.g. the center) of the pixel 36 concerned is located inside the reduced pattern 44, the irradiation coefficient calculation unit 62 calculates, for each pixel 36, the irradiation coefficient "k" to be 1. When the representation position of the pixel 36 concerned is located outside the enlarged pattern 42, the irradiation coefficient calculation unit 62 calculates, for each pixel 36, the irradiation coefficient "k" to be 0. Moreover, when the representation position of the pixel 36 concerned is located between the enlarged pattern 42 and the reduced pattern 44, the irradiation coefficient calculation unit 62 calculates, for each pixel 36, the irradiation coefficient "k" by using a function "f", (that is k=f). In regard to this point, what has just been described is the same as set forth in the first embodiment. Specifically, when the representation position of the pixel 36 concerned is located both inside the enlarged pattern 42 and outside the reduced pattern 44, the irradiation coefficient calculation unit 62 calculates, for each pixel 36, the irradiation coefficient "k" by using a value M being less than or equal to the shift number. The calculation of the function "f" is shown in FIG. 28A. The relation between the shift multiplicity and the shift number "m" is shown in FIG. 28B. As shown in FIG. 28A, the function "f" is defined using a distance L (LX or LY) with a sign from the object pixel to the side of the original figure pattern 40, and the value M being less than or equal to the shift number. When the distance L, with a sign, of the pixel 36 concerned is less than or equal to $(M-1)/(2M)$, the function "f" is defined to be "f"=0 When the distance L, with a sign, of the pixel 36 concerned is greater than or equal to $(M+1)/(2M)$, the function "f" is defined to be "f"=1. When the distance L, with a sign, of the pixel 36 concerned is greater than $(M-1)/(2M)$ and less than $(M+1)/(2M)$, the function "f" is defined to be "f"=$(ML-(M-1)/2)$. When the distance L, with a sign, of the pixel 36 concerned is between $(M-1)/(2M)$ and $(M+1)/(2M)$, the value of the function "f" increases in linear proportion as shown in FIG. 28C. The remaining steps subsequent to the irradiation coefficient calculation step (S113) are the same as those in the first embodiment.

As described above, even when the shift number "m" is a large value, it is possible, by changing the shift number "m" to the value M being less than or equal to the shift number, to suppress the gradient of the graph from becoming steep. Therefore, dose radical change can be suppressed. Since the distance L with a sign changes for each pass, the function "f" (irradiation coefficient "k") changes for each pass. As a result, since adjustment may be performed using beams of a plurality of passes rather than using an individual beam of a single pass, it is possible to perform averaging. Thus, the writing precision can be enhanced.

Although, in the examples of FIGS. 8A to 8H, the number of a plurality of writing positions which shifted in the x is the same as that shifted in the y direction, that is the case where the shift number "m" is uniquely defined with regard to the relation between the shift number and the shift multiplicity, it is not limited thereto.

Figure 29:
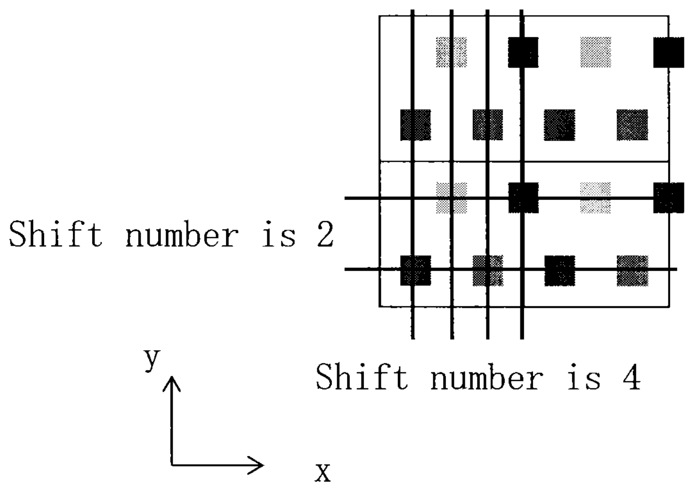
FIG. 29 shows an example of the relation between the shift number and the shift multiplicity according to the second embodiment.

FIG. 29 shows an example of the relation between the shift number and the shift multiplicity according to the second embodiment. FIG. 29 shows a case of a virtual reference grid and four writing positions in the multiple writing with the shift multiplicity N=4. In the case of FIG. 29, since there are four writing positions shifted in the x direction, the shift number "m" in the x direction is 4. Since there are two writing positions shifted in the y direction, the shift number "m" in the y direction is 2. Therefore, the numbers of a plurality of writing positions shifted in the x and y directions are different from each other. In such a case, according to the second embodiment, the shift number "m" is defined by using a smaller number. Accordingly, the shift number of writing positions shifted in the y direction is used in the case of FIG. 29. Therefore, according to the second embodiment, as the value M being less than or equal to the shift number, a value less than or equal to the shift number "m" which is defined by using the smaller number is used.

Embodiments have been explained referring to concrete examples described above. However, the present invention is not limited to these specific examples. For example, if the case where the numbers of a plurality of writing positions shifted in the x and y directions are different from each other as shown in FIG. 29 is applied to the first embodiment, a smaller number in the numbers of a plurality of writing positions shifted in the x and y directions should be used to define the shift number "m". In regard to the case of FIG. 29, the shift number of writing positions shifted in the y direction should be used.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other charged particle beam writing apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:

an enlarged pattern forming processing circuitry configured to form an enlarged pattern by enlarging a figure pattern to be written, depending on a shift number which is defined by a number of a plurality of writing positions shifted in one of x and y directions in a plurality of writing positions where multiple writing is performed while shifting a position;

a reduced pattern forming processing circuitry configured to form a reduced pattern by reducing the figure pattern, depending on the shift number;

an irradiation coefficient calculation processing circuitry configured to calculate an irradiation coefficient for modulating a dose of a charged particle beam irradiating each of a plurality of small regions obtained by dividing a writing region into meshes, using the enlarged pattern and the reduced pattern; and a writing mechanism including a charged particle beam source, a deflector, and a stage on which a target object is placed, and the writing mechanism configured to write the figure pattern on the target object by a multiple writing method performed while shifting the position, using the charged particle beam of the dose obtained for the each of the plurality of small regions by using the irradiation coefficient.

2. The apparatus according to claim 1, wherein the irradiation coefficient calculation processing circuitry calculates the irradiation coefficient to be 1 for the each of the plurality of small regions in a case where a representation position of a small region concerned in the plurality of small regions is located inside the reduced pattern.

3. The apparatus according to claim 1, wherein the irradiation coefficient calculation processing circuitry calculates the irradiation coefficient to be 0 for the each of the plurality of small regions in a case where a representation position of a small region concerned in the plurality of small regions is located outside the enlarged pattern.

4. The apparatus according to claim 1, wherein the irradiation coefficient calculation processing circuitry calculates the irradiation coefficient by using the shift number for the each of the plurality of small regions in a case where a representation position of a small region concerned in the plurality of small regions is located both inside the enlarged pattern and outside the reduced pattern.

5. A charged particle beam writing method comprising:

forming an enlarged pattern by enlarging a figure pattern to be written, depending on a shift number which is defined by a number of a plurality of writing positions shifted in one of x and y directions in a plurality of writing positions where multiple writing is performed while shifting a position;

forming a reduced pattern by reducing the figure pattern, depending on the shift number;

calculating, using the enlarged pattern and the reduced pattern, an irradiation coefficient for modulating a dose of a charged particle beam irradiating each of a plurality of small regions obtained by dividing a writing region into meshes; and writing the figure pattern on a target object by a multiple writing method performed while shifting the position, using the charged particle beam of the dose obtained for the each of the plurality of small regions by using the irradiation coefficient.

6. A charged particle beam writing apparatus comprising:

an enlarged pattern forming processing circuitry configured to form an enlarged pattern by enlarging a figure pattern to be written, depending on a value less than or equal to a shift number defined by a number of a plurality of writing positions shifted in one of x direction and y direction in a plurality of writing positions where multiple writing is performed while shifting a position;

a reduced pattern forming processing circuitry configured to form a reduced pattern by reducing the figure pattern, depending on the value less than or equal to the shift number;

an irradiation coefficient calculation processing circuitry configured to calculate, using the enlarged pattern and the reduced pattern, an irradiation coefficient for modulating a dose of a charged particle beam irradiating each of a plurality of small regions obtained by dividing a writing region into meshes; and a writing mechanism configured to write the figure pattern on a target object by a multiple writing method performed while shifting the position, using the charged particle beam of the dose obtained for the each of the plurality of small regions by using the irradiation coefficient.

7. The apparatus according to claim 6, wherein the irradiation coefficient calculation processing circuitry calculates the irradiation coefficient by using the value less than or equal to the shift number for the each of the plurality of small regions in a case where a representation position of a small region concerned in the plurality of small regions is located both inside the enlarged pattern and outside the reduced pattern.

8. The apparatus according to claim 6, wherein, in a case where the number of the plurality of writing positions shifted in the x direction is different from the number of the plurality of writing positions shifted in the y direction, the shift number is defined by a smaller number of the number of the writing positions shifted in the x direction and the number of the writing positions shifted in the y direction, and the value less than or equal to the shift number defined by the smaller number is used.

9. The apparatus according to claim 6, wherein a value greater than or equal to 1 is used as the value less than or equal to the shift number.

10. A charged particle beam writing method comprising:

forming an enlarged pattern by enlarging a figure pattern to be written, depending on a value less than or equal to a shift number defined by a number of a plurality of writing positions shifted in one of x and y directions in a plurality of writing positions where multiple writing is performed while shifting a position;

forming a reduced pattern by reducing the figure pattern, depending on the value less than or equal to the shift number;

calculating, using the enlarged pattern and the reduced pattern, an irradiation coefficient for modulating a dose of a charged particle beam irradiating each of a plurality of small regions obtained by dividing a writing region into meshes; and writing the figure pattern on a target object by a multiple writing method performed while shifting the position, using the charged particle beam of the dose obtained for the each of the plurality of small regions by using the irradiation coefficient.

* * * * *